(12) United States Patent
Aalto et al.

(10) Patent No.: US 9,515,685 B2
(45) Date of Patent: Dec. 6, 2016

(54) APPARATUS AND METHOD FOR SIGNAL PREDISTORTION

(71) Applicant: Broadcom Corporation, Irvine, CA (US)

(72) Inventors: Juhani Kalervo Aalto, Espoo (FI); Jari Johannes Heikkinen, Helsinki (FI)

(73) Assignee: BROADCOM CORPORATION, Irvine, CA (US)

( * ) Notice: Subject to any disclaimer, the term of this patent is extended or adjusted under 35 U.S.C. 154(b) by 155 days.

(21) Appl. No.: 14/249,796

(22) Filed: Apr. 10, 2014

(65) Prior Publication Data

US 2014/0308908 A1  Oct. 16, 2014

(30) Foreign Application Priority Data

Apr. 11, 2013 (GB) .................................. 1306596.6

(51) Int. Cl.
| | |
|---|---|
| *H04B 1/04* | (2006.01) |
| *H03F 1/22* | (2006.01) |
| *H03F 1/32* | (2006.01) |
| *H03F 3/24* | (2006.01) |
| *H03F 3/45* | (2006.01) |

(52) U.S. Cl.
CPC ............ *H04B 1/0475* (2013.01); *H03F 1/223* (2013.01); *H03F 1/3241* (2013.01); *H03F 3/245* (2013.01); *H03F 3/45179* (2013.01); *H03F 2203/45394* (2013.01); *H03F 2203/45512* (2013.01); *H03F 2203/45528* (2013.01); *H04B 2001/0425* (2013.01)

(58) Field of Classification Search
CPC ........... H04B 1/62; H04B 1/0475; H04B 1/04; H04B 2001/0425; H03F 1/3247; H03F 1/3282; H03F 1/3241; H03F 1/223; H03F 3/245; H03F 3/45179; H03F 2203/45394; H03F 2203/45312; H03F 2203/45523
See application file for complete search history.

(56) References Cited

U.S. PATENT DOCUMENTS

| | | | |
|---|---|---|---|
| 7,848,717 B2 | 12/2010 | Liu | |
| 2006/0217083 A1* | 9/2006 | Braithwaite | .......... H03F 1/3282 455/114.3 |
| 2011/0025414 A1* | 2/2011 | Wolf | ..................... H03F 1/3247 330/149 |
| 2012/0028591 A1* | 2/2012 | Montalvo | ............ H04B 1/0475 455/114.3 |

FOREIGN PATENT DOCUMENTS

| | | |
|---|---|---|
| EP | 1727277 | 11/2006 |
| GB | 2382480 | 5/2003 |

* cited by examiner

*Primary Examiner* — Thanh Le
(74) *Attorney, Agent, or Firm* — Oblon, McClelland, Maier & Neustadt, L.L.P.

(57) ABSTRACT

Apparatus and a method for predistortion of a radio-frequency signal are described. At least one predistortion unit is described that is arranged to receive an analog baseband signal before amplification and to generate an analog predistortion signal based on said analog baseband signal. At least one mixer unit is also described and may be electrically coupled to the at least one predistortion unit. In this case, the at least one mixer unit is arranged to receive the analog baseband signal before amplification and the analog predistortion signal and to generate a weighted combination of said signals.

14 Claims, 19 Drawing Sheets

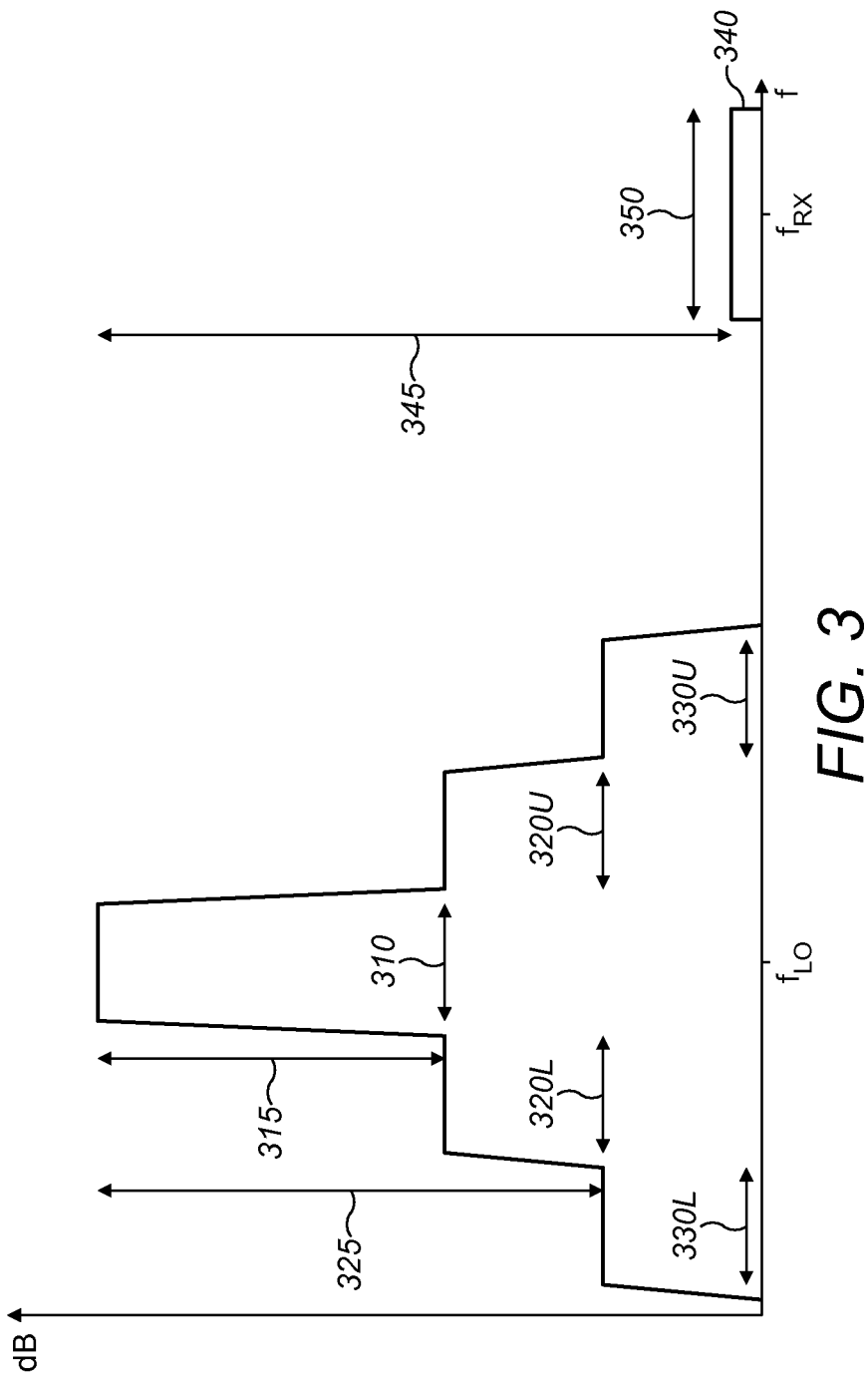

APPARATUS AND METHOD FOR SIGNAL PREDISTORTION

TECHNICAL FIELD

The present invention relates to an apparatus and method for predistorting a signal, such as a radio-frequency signal.

BACKGROUND

An example of a device that is capable of transmitting a signal, commonly referred to as a transmitter, is shown schematically in FIG. 1. A signal, typically a radio-frequency signal, is generated by signal electronics 110, which may be arranged to modulate a carrier signal with a baseband signal, the carrier signal typically being a periodic waveform at a given frequency that may be transmitted and the baseband signal representing information to be transmitted. In FIG. 1 the signal electronics 110 pass a modulated signal to an amplifier 120, which may be a power amplifier. In certain arrangements a front-end module 130 may also be provided to provide processing prior to transmission from at least one antenna 140. These arrangements are often found in user equipment such as mobile communications devices that communicate via a network interface comprising a radio transceiver to a network of base stations connected to a telecommunications network.

Most amplifiers, for example power amplifier 120, have a linear range of operation and a non-linear range of operation. This is shown by example operating curve 205 in FIG. 2A. As input power is increased the amplifier moves from the linear range of operation to the non-linear range of operation. In the linear range of operation an output power is proportional to an input power as shown by line 210. In the non-linear range output power is a non-linear function of input power, wherein eventually output power reaches a saturation point 220. In the non-linear range spectral broadening of a radio-frequency signal may occur. An example of this is shown in FIG. 2B. In this case a radio-frequency signal has a specified range that is centered around a local oscillator (LO) frequency 250. This radio-frequency signal is amplified by amplifier 120 for transmission by antenna 140. In the example, non-linear characteristics of the amplifier 120 generate spectral components with frequencies in a range below 260L and above 260U the specified radio-frequency range 255 of the amplified signal. These spectral components are referred to as intermodulation products or distortions as they occur outside of specified modulation bands (such as range 255). If left unmodified, these distortions can lead to an increased bit error rate at a receiver of the transmitted signal. Transmission formats, such as wideband code division multiple access (WCDMA) used in $3^{rd}$ generation (3G) systems or orthogonal frequency division multiplexing (OFDM) used in $4^{th}$ generation (4G) systems such those based on Long Term Evolution (LTE) standards are vulnerable to nonlinear distortions as their signals have relatively high peak-to-average power ratios.

One method of reducing and/or avoiding non-linearities and their effects is to restrict operation of an amplifier to the linear range. This is sometimes referred to as "back-off" operation as it involves "backing off", i.e. reducing, input power from a 3 dB operating point to an operating point marking the end of the linear range. For example, in FIG. 2A this is shown by arrow 225. However, this may decrease power efficiency for signals with relatively high peak-to-average power ratios and/or lead to degraded noise performance for current-mode modulators.

Another method of reducing and/or avoiding non-linearities and their effects is to "predistort" a signal before amplification to compensate for the non-linear characteristics of an amplifier. This is illustrated in FIG. 2C and is often also referred to as "linearizing" a signal. Chart 275 shows the operating characteristics of an amplifier, similar to chart 200, including linear and non-linear regions of operation. Based on these operating characteristics a signal is modified, typically to have non-linear characteristics as shown in chart 270, such that when the signal is amplified the result is a linear region of operation as shown in chart 280. Many different linearization techniques are available to predistort the signal. FIG. 2A shows an area of operation 230 that may be achieved, for example in addition to area 215, when using certain linearization techniques.

Typically, such existing linearization techniques require a trade-off between different operating requirements. It would be useful to provide an improved apparatus and method for predistorting or linearizing a signal.

BRIEF DESCRIPTION OF THE DRAWINGS

FIG. 3 is a schematic chart showing requirements for an output spectrum of a transmitter according to an example;

DETAILED DESCRIPTION

Figure 1:
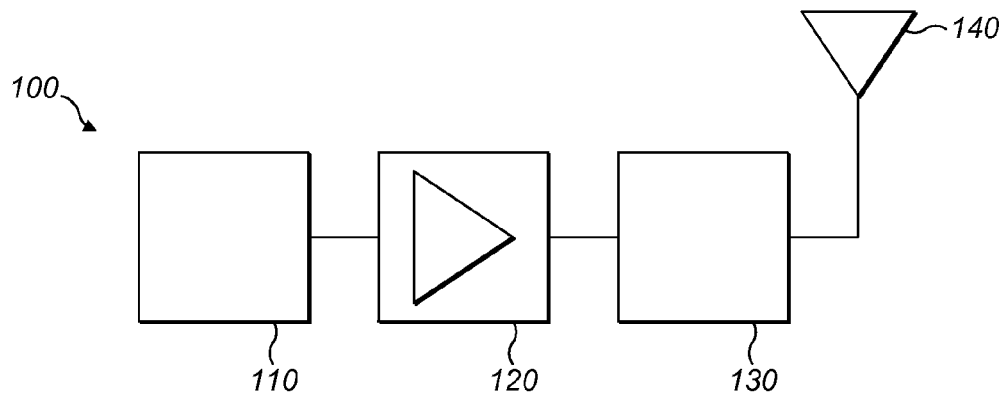
FIG. 1 is a schematic diagram showing a simplified transmitter.
Figure 2A:
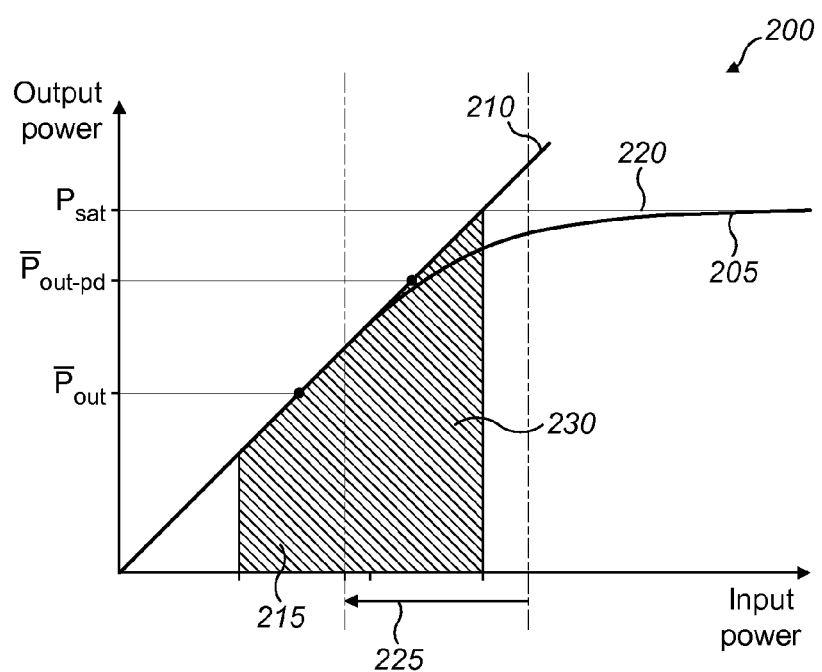
FIG. 2A is a schematic chart showing operating characteristics of an amplifier
Figure 2B:
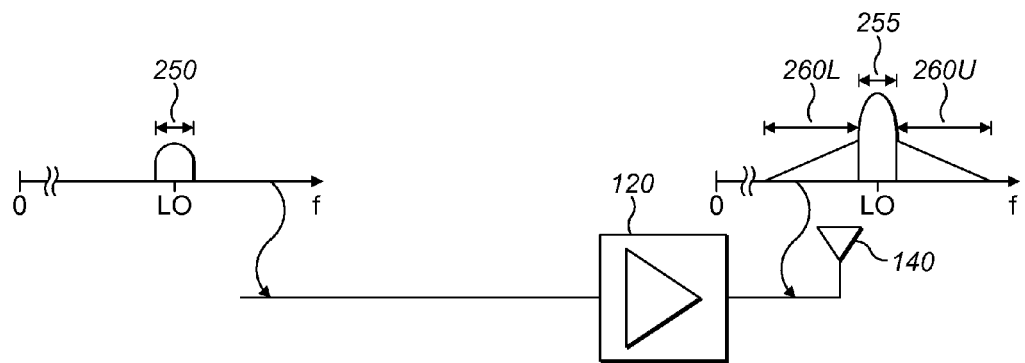
FIG. 2B is a schematic diagram showing how intermodulation products may occur following amplification.
Figure 2C:
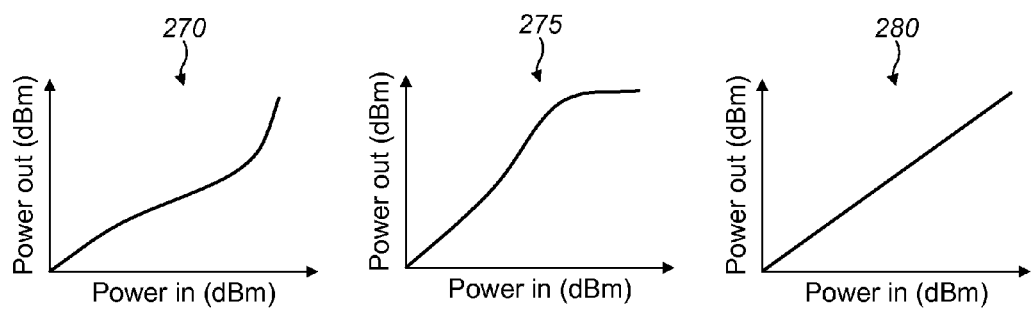
FIG. 2C comprises three schematic charts that show how a signal may be linearized.

According to a first aspect of the described examples, there is provided apparatus for predistortion of a radio-frequency signal comprising at least one predistortion unit arranged to receive an analog baseband signal before amplification and to generate an analog predistortion signal based on said analog baseband signal and at least one mixer unit electrically coupled to the at least one predistortion unit, wherein the at least one mixer unit is arranged to receive the analog baseband signal before amplification and the analog predistortion signal and to generate a weighted combination of said signals.

According to a second aspect of the described examples, there is provided a method of predistorting of a radio-frequency signal comprising receiving an analog baseband signal before amplification; passing said received analog baseband signal to a first path and a second path; generating, via the second path, an analog predistortion signal based on said analog baseband signal; and combining, in a weighted summation, respective outputs of the first and second paths.

According to a third aspect of the described examples, there is provided a modulator for processing an analog signal prior to amplification by a power amplifier comprising a first input arranged to receive an analog signal derived from an analog baseband signal; a second input arranged to receive a distortion component derived from the analog baseband signal; a local oscillator portion arranged to receive one or more local oscillator signals; a first transistor electrically coupled to the first input and the local oscillator portion, wherein the first transistor is arranged to combine one of said one or more local oscillator signals with the analog signal from the first input, the first transistor having a first amplification factor; and a second transistor electrically coupled to the second input and the local oscillator portion, wherein the second transistor is arranged to combine one of said one or more local oscillator signals with the distortion component from the second input, the second transistor having a second amplification factor, wherein the first and second amplification factors are configured to weight an output of the second transistor in relation to an output of the first transistor, and wherein the output of the first transistor and the output of the second transistor are electrically coupled so as to output a modulated and predistorted analog signal for amplification by a power amplifier.

According to a fourth aspect of the described examples, there is provided a predistortion unit for processing an analog signal prior to amplification by a power amplifier comprising: a first input arranged to receive an analog signal derived from an analog baseband signal; a predistortion transistor electrically coupled to the first input, the predistortion transistor having a predistortion amplification factor; and a signal extraction portion electrically coupled between the first input and an output of the predistortion transistor, wherein the signal extraction portion is arranged to present a virtual ground to the analog signal received at the first input so as to extract a distortion component derived from the output of the predistortion transistor, the distortion component being weighted by the predistortion amplification factor of the predistortion transistor.

FIG. 3 shows an example of spectral requirements for a radio-frequency mobile communications device. These may be set as part of mobile radio standards. Core spectral band 310 represents a reserved range of frequencies for transmitting a signal, where the frequencies are centered upon a frequency of a local oscillator ($f_{LO}$). Adjacent spectral bands 320 and 330 represent tolerated frequency components in adjacent upper (U) and lower (L) channels. A first set of spectral bands 320 are required to have a power level that is a first given ratio of the power level of core spectral band 310. This is shown by arrow 315 in FIG. 3. A second set of spectral bands 330 are required to have a power level that is a second given ratio of the power level of core spectral band 310. This is shown by arrow 325 in FIG. 3. Outside a range of a given allowed spectral broadening a power level should be at or near 0. FIG. 3 is provided to help explain the present examples and other spectral requirements may be set for other implementations.

FIG. 3 also shows a portion of the spectrum that is reserved for the reception of signals. For example, they may represent frequencies on which a transceiver receives incoming communications. These signals typically have a much lower energy, with the noise floor, i.e. the allowed noise level to allow for successful reception, being shown by the power level of block 340. Reception occurs at a band of frequencies 350 that are offset from the transmission frequencies. As shown by arrow 345 there is the potential for signal components produced by transmission frequencies to interfere with reception as they have a power level that is considerably larger than that expected of the received signals. As such an output spectrum of a transmitter must conform to certain linearity requirements, as set out by spectral bands 320 and 330, and certain noise level requirements, as set out by noise floor 340. This in turn requires a transmitter with linear characteristics and a low output noise level in reception bands.

Certain examples described herein provide apparatus and methods for implementing predistortion without sacrificing noise performance for reception. Certain examples described herein separate a signal to be transmitted onto respective first and second circuit paths. This enables specific channel filtering to be applied on each path. The second path may represent an auxiliary compensation path wherein predistortion and noise attenuation may be applied. Signals on each path may be combined in a weighted combination, with each path having a specified weighting factor.

Figure 4:
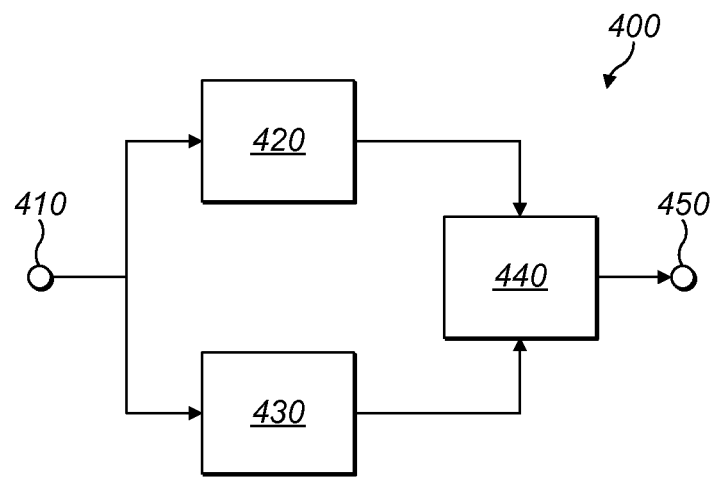
FIG. 4 is a schematic diagram showing an apparatus for predistorting a signal according to an example.

FIG. 4 shows an example of an apparatus 400 for predistorting a signal according to an example. At an input 410 a baseband signal is received. This baseband signal may represent an unmodulated analog signal comprising information to be transmitted, for example containing frequency components centered around 0 Hz or in a low-frequency range. In the apparatus of FIG. 4 the signal paths from the input 410 are split. A first path passes a signal component to a first processing block 420. A second path passes a signal component to a second processing block 430. An output of the first processing block 420 and an output of the second processing block 430 are then sent to a third processing block 440, where the signals are combined and passed to an output 450.

In certain examples the first processing block 420 comprises channel filtering that is applied to the baseband signal from the input 410. In other examples the first processing block 420 may comprise a pass-through block or electrical coupling that appropriately passes the baseband signal to the third processing block 440. In certain examples the second processing block 430 comprises one or more of signal predistortion and signal cancellation. In certain cases signal cancellation may form a part of a predistortion process. In certain examples the third processing block 430 combines the outputs of the first processing block 420 and the second processing block 430 in a weighted summation.

Figure 5:
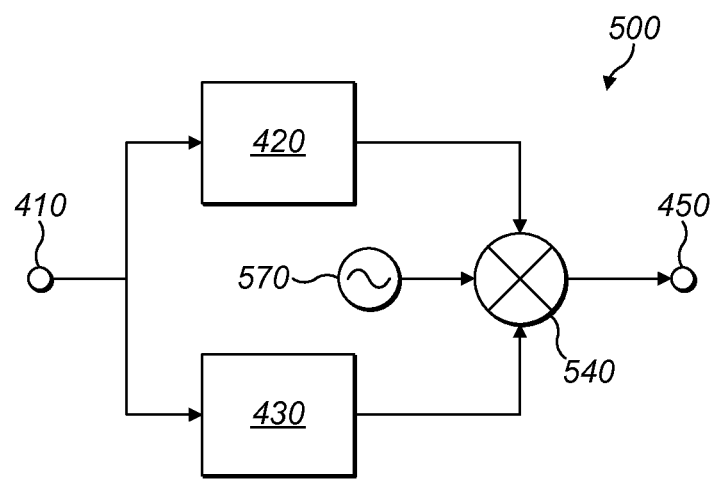
FIG. 5 is a schematic diagram showing a first variation of the apparatus of FIG. 4.

FIG. 5 shows a variation 500 of the example of FIG. 4 wherein the third processing block 430 comprises at least a mixer unit 540 that modulates or upconverts the outputs of the first processing block 420 and the second processing block 430 by respectively combining the signals with a signal produced by a local oscillator 570. In this case the outputs of the first processing block 420 and the second processing block 430 comprise analog signals that are converted so that they may be transmitted in a frequency band such as core spectral band 310 in FIG. 3 that is centered on a frequency of a carrier waveform generated by a local oscillator.

In the examples of FIGS. 4 and 5, main analog processing is applied by the first path from the input 410 to the output 450 via the first and third processing components 420 and 440/540. This main analog processing provides good noise performance and good efficiency. For example, a direct current $I_{DC}$ equals a peak current $I_{peak}$, the peak current being the peak value of a signal current in a current mode mixer that implements the third processing component 440/540. Auxiliary analog processing is applied by the second path from the input 410 to the output 450 via the second and third processing components 430 and 440/540. This auxiliary analog processing provides adaptive wideband compensation for predistortion with moderate noise performance and efficiency (e.g. moderate as compared to the analog processing). It compensates for any deviations from linearity that result from the main analog processing.

In certain examples the auxiliary processing may apply may apply analog signal processing using the second processing block 430. Two variations that apply analog auxiliary processing are shown in FIGS. 6A and 6B.

Figure 6A:
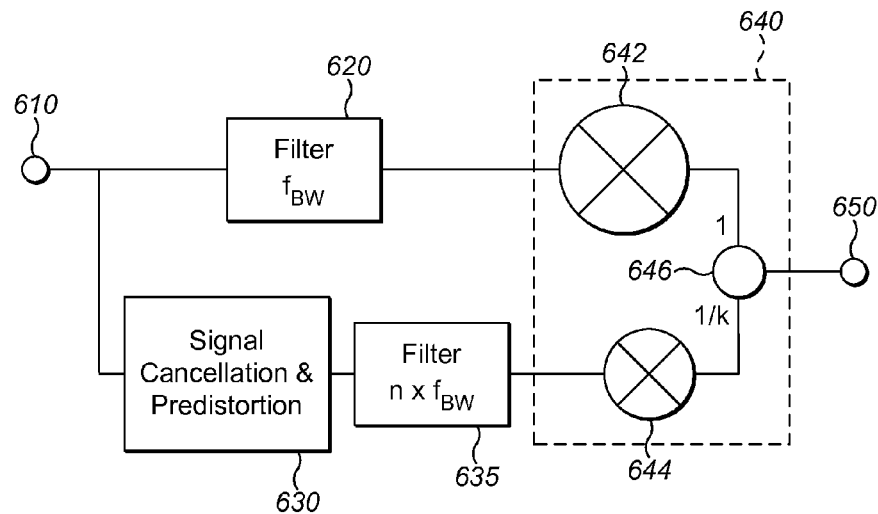
FIG. 6A is a schematic diagram showing a second variation of the apparatus of FIG. 4.

FIG. 6A shows an apparatus for predistorting a signal using analog techniques. An analog baseband signal is received at an input 610. The analog baseband signal is passed to a first filter 620 with a first filter bandwidth of $f_{BW}$. This first filter bandwidth $f_{BW}$ may be selected to filter noise generated by analog baseband processing, for example it may be based on a passive real pole to maximize noise performance (e.g. 4 MHz for a WCDMA system). It is also passed to an analog signal cancellation and predistortion unit 630 that applies signal cancellation and predistortion. The output of the analog signal cancellation and predistortion unit 630 is then passed to one or more second filters 635 that each have respective second filter bandwidths. There may be n second filters to correspond to a number of intermodulation distortion components that need to be cancelled. For example, n may be 3 or 5. In certain cases the filters are arranged to equalize the phase lag of both filter sets (e.g. of both circuit branches). The outputs of the first and second filters 620, 635 are both input to a third processing block 640. In FIG. 6A the third processing block 640 comprises a first mixer unit 642 that upconverts (e.g. mixes with a local oscillator signal) the output of the first filter 620. The third processing block 640 also comprises a second mixer unit 644 that upconverts the output of the second filter 635. Following upconversion the resulting signals are summed in node 646.

As is shown in FIG. 6A the signal output from the first mixer unit 642 has a first weight that is applied and the signal output from the second mixer unit 644 has a second weight that is applied. These weights may be applied by, amongst others, the mixing process in a respective one of mixer units, as part of the respective circuit pathways and/or by the summation process applied at node 646. In the example of FIG. 6A the first weight is 1 and the second weight is 1/k. In this case k is a scaling factor between the main analog processing path, which may be seen to carry an analog signal with a signal and a distortion term, and the auxiliary analog processing path, which may be seen to carry one or more distortion terms. The larger the scaling term k the more noise from the auxiliary analog processing path is attenuated. As, in certain examples, the auxiliary analog processing path does not significantly contribute to an output signal level, the scaling factor k may be made large. A large scaling factor k may then increase efficiency. The scaling factor k may be directly or indirectly related to a size of one or more transistors that form part of circuitry for the processing paths. For example, the scaling factor k may be directly related to the geometry of a patterned semiconductor, such as a width/length (W/L) ratio. In any case, a signal representing a weighted combination in the ration 1:1/k is output at output 650.

Figure 6B:
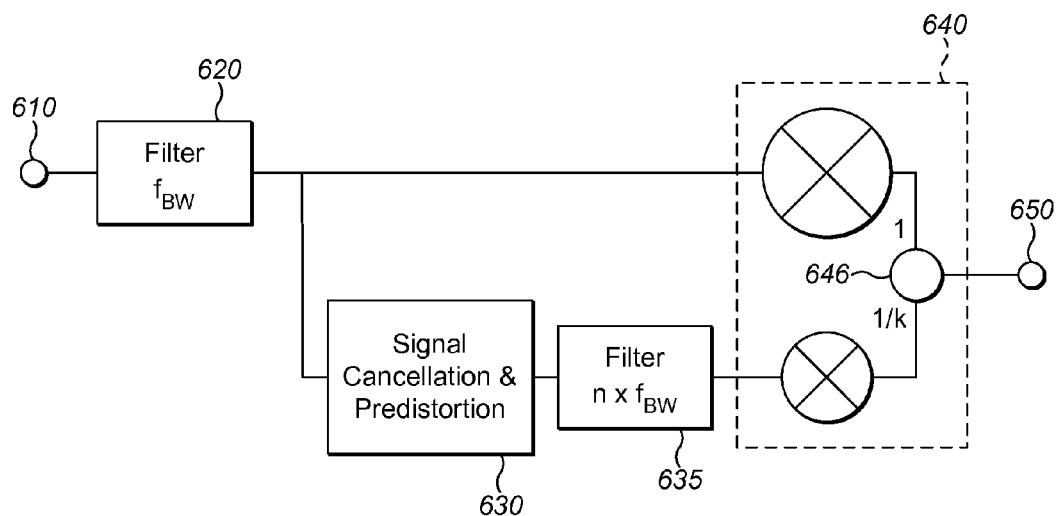
FIG. 6B is a schematic diagram showing a third variation of the apparatus of FIG. 4.

FIG. 6B shows an alternative variation to that of FIG. 6A. In this case channel filtering for an analog baseband signal is applied by a first filter 620 before the signal is passed to the two circuit paths, e.g. a filtered output is supplied to the third processing component 640 and the analog signal cancellation and predistortion unit 630. This variation provides for increased filtering of a signal undergoing auxiliary processing on the second path, and thus enables greater attenuation of baseband noise for certain implementations that require it.

A number of electrical circuits that are suitable for performing the processing described above will now be described with reference to the examples and variations of FIGS. 7 to 14. These circuits are shown for example and variations and modifications are expected depending on a particular implementation. Additionally, features from any one of the examples and/or variations may be combined with any other of the examples and/or variations and features may be added, omitted and/or modified as necessary.

Figure 7:
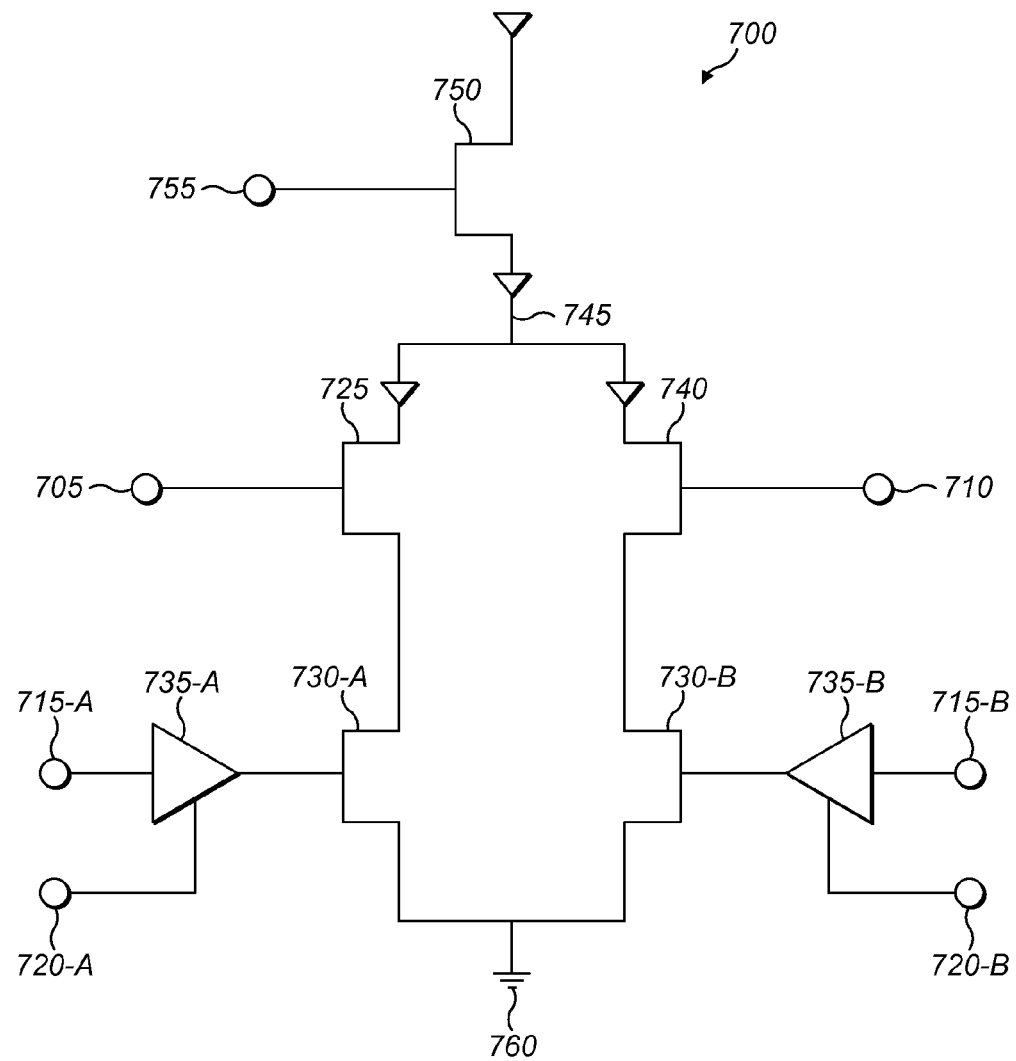
FIG. 7 is a schematic circuit diagram showing an electrical circuit for implementing a mixer unit according to an example.

FIG. 7 shows an electrical circuit for a mixer unit 700 according to an example. At least one mixer unit as shown in FIG. 7 may be used to implement the third processing blocks 440, 640 of FIGS. 4, 5, 6A and 6B or the mixer unit 540 of FIG. 5. The mixer unit shown in FIG. 7 represents at least a portion of single-ended modulator; a similar circuit may be applied for the two portions of a differential signal.

The circuit of FIG. 7 comprises three main inputs: a first circuit input 705, a second circuit input 710, and a pair of local oscillator circuit inputs 715-A, 715-B. The circuit also comprises a pair of control inputs 720-A, 720-B. The first circuit input 705 is electrically coupled to the gate of a first transistor 725. The source of the first transistor 725 is electrically coupled to a drain of the first of a pair of local oscillator transistors 730-A. A gate of the first local oscillator transistor 730-A is electrically coupled to a local oscillator amplifier 735-A that is controlled using control input 720-A.

The local oscillator amplifier 735-A is in turn arranged to receive a signal from the first of the pair of local oscillator circuit inputs 715-A. The drain of the first transistor is electrically coupled to the drain of a second transistor 740 at summation node 745. Summation node 745 is in turn electrically coupled to the source of a gain control transistor 750, whose gate is electrically coupled to an automatic gain control input 755. In this case, an output of the circuit is presented at the drain of the gain control transistor 750 (i.e. at the top of the Figure). The gate of the second transistor 740 is electrically coupled to the second circuit input 710. The source of the second transistor 740 is electrically coupled to a drain of the second of the pair of local oscillator transistors 730-B. A gate of the second local oscillator transistor 730-B is electrically coupled to a local oscillator amplifier 735-B that is controlled using control input 720-B. The local oscillator amplifier 735-B is in turn arranged to receive a signal from the second of the pair of local oscillator circuit inputs 715-B. The sources of both local oscillator transistors 730 are electrically coupled to ground 760.

In one implementation, the first circuit input 705 is arranged to receive an analog baseband signal s. A local oscillator signal representing a carrier wave generated by a local oscillator is received the first local oscillator input 715-A. This local oscillator signal is then amplified by local oscillator amplifier 735-A under the control of the first control input 720-A. By coupling the source of the first transistor 725 to the drain of the first local oscillator transistor 730-A, the analog baseband signal may be upconverted, i.e. modulated using the local oscillator signal. The first transistor 725 shifts the phase of the upconverted analog signal s by 180 degrees (i.e. pi radians) before it is summed at summation node 745. Upconversion also results in the introduction of a signal distortion component d that is present in the signal at the drain of the first transistor 725. For example, a signal distortion component d may result from at least nonlinear conditions of the first transistor.

Figure 8:
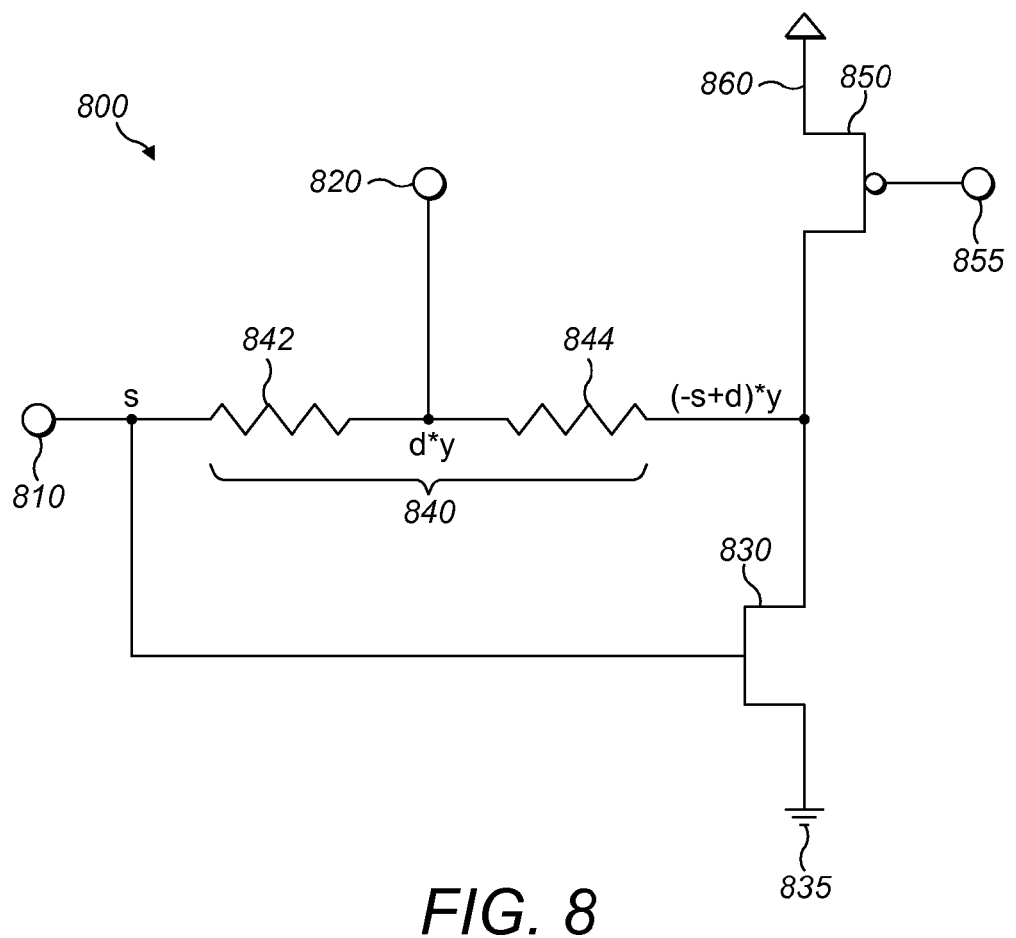
FIG. 8 is a schematic circuit diagram showing an electrical circuit for implementing a predistortion unit according to an example.

On the other branch of the mixer unit 700, the second circuit input 710 is arranged to receive a weighted distortion component d*y from a predistortion unit. An example of a predistortion unit is shown in FIG. 8 and is described in more detail below. In this case the distortion component is represented by signal d and the weighting has a value (or scaling factor) of y. The weighted distortion component is applied to the gate of the second transistor 740, wherein the component is upconverted by the coupling to the second local oscillator transistor 730-B. In a similar manner to the first branch of the circuit, a second local oscillator signal is received at the second local oscillator input 715-B, this signal then being amplified by local oscillator amplifier 735-B under the control of the second control input 720-B.

In this example, the weighted summation of the upconverted baseband signal and the upconverted distortion component has two elements. A first element of the weighting is provided by the scaling factor y. In the present example, this is set by the predistortion unit. A second element is provided by selecting the amplification factors (i.e. gains) of the first and second transistors 725, 740 such that the respective signals are scaled in the ratio 1:1/x, e.g. the first transistor 725 may have a gain of 1 and the second transistor 740 may have a gain of 1/x. In this manner a weighted distortion component present at the gate of the second transistor 740 is effectively scaled by 1/x by the action of the second transistor 740, the resultant signal being present at the drain of said transistor. In this case x may be equivalent to the scaling factor k described with reference to FIG. 6A. A phase of the signal present at drain of the second transistor 740 is also shifted by 180 degrees. Correspondingly the same ratio is also applied to the first and second local oscillator transistors 730-A, 730-B, e.g. the first local oscillator transistor 730-A may have a gain of 1 and the second local oscillator transistor 730-B may have a gain of 1/x. In certain examples at least one of the transistor pairs, e.g. first and second transistors 725, 740 and local oscillator transistors 730, comprise transistors of a common type, e.g. N-channel metal-oxide-semiconductor field-effect transistors (MOSFETs), where the amplification factors accordingly differ. In the present example the distortion components present in the signals at the drains of each of the first and second transistors 725, 740 cancel each other, in whole or in part depending on the implementation. This is achieved by appropriately configuring the values of x and y.

Following summation at summation node 745, if required, the resultant signal may be subject to automatic gain control via gain control transistor 750, whose source is electrically coupled to the summation node 745 and whose gate is electrically coupled to a gain control signal 755. In certain cases (not shown), the drain of the transistor may be electrically coupled to a resistor-inductor-capacitor (RLC) resonator circuit forming part of transmitter electronics.

FIG. 8 shows an electrical circuit for a predistortion unit 800 according to an example. At least one predistortion unit as shown in FIG. 8 may be used to implement the second processing block 430 FIGS. 4 and 5 or at least a portion of the signal cancellation and predistortion unit 630 of FIGS. 6A and 6B. In the latter case the signal cancellation function of unit 630 may be implemented by the mixer unit shown in FIG. 7. The predistortion unit 800 shown in FIG. 8 represents a single-ended case; a similar circuit may be applied for the two portions of a differential signal.

The circuit of FIG. 8 has a circuit input 810 and a circuit output 820. The circuit input 810 is electrically coupled to a gate of a predistortion transistor 830. A source of the predistortion transistor 830 is then electrically coupled to ground 835. The circuit input 810 is also electrically coupled to a voltage divider 840 comprising a first resistor 842 and a second resistor 844 electrically coupled in series. A first end of the first resistor 842 is electrically coupled to the circuit input 810. A second end of the first resistor 842 and a first end of the second resistor 844 are electrically coupled to the circuit output 820. A second end of the second resistor 844 is electrically coupled to a drain of the predistortion transistor 830. The drain of the predistortion transistor is also electrically coupled to a power supply via supply transistor 850; a gate of the supply transistor 850 being electrically coupled to a voltage bias 855 for the supply transistor 850. The supply transistor 850 is arranged to match, for predistortion transistor 830, the operating conditions that are present for the first transistor 725. In certain cases the same current density is matched for both the first transistor 725 and the predistortion transistor 830, albeit subject to the scaling factor x. The supply transistor 850 in this example is a P-channel MOSFET.

The predistortion transistor 830 is selected to match the first transistor 725 of the mixer unit 700 but with a different amplification factor. For example, the predistortion transistor 830 may also be an N-channel MOSFET. The amplification factor of the predistortion transistor 830 is selected to be y times the amplification factor of the first transistor 725. Any resistive attenuation due to the first and second resistor 842 and 844 may in certain cases be compensated by using appropriately selected transistor characteristics.

In one implementation, the circuit input 810 is arranged to receive the analog baseband signal s that is also received by the first circuit input 705 of the mixer unit 700 of FIG. 7. When the analog baseband signal is applied to the circuit input 810 it is passed to the gate of the predistortion transistor 830 and a scaled version of the signal is generated at the drain of said transistor. As, apart from a different amplification factor, the predistortion transistor 830 is matched to the first transistor 725 of the mixer unit 700, the signal present at the drain of the predistortion transistor 830 is proportional to the signal present at the drain of the first transistor 725, wherein the ratio of proportionality is based on the amplification factor ratio of both transistors. In this described example the amplification factor ratio is 1:y and as such the signal at the drain of the predistortion transistor 830 is greater than the signal present at the drain of the first transistor 725 by a factor y. If the signal at the drain of the first transistor 725 is said to be −s+d, where d is a distortion component, then the signal at the drain of the predistortion transistor 830 is (−s+d)*y. Here, in effect, the predistortion transistor 830 is arranged to replicate the same nonlinear conditions that are applied by the first transistor 725 in FIG. 7, i.e. to generate a distortion component d that matches the distortion component d generated by the first transistor 725, albeit scaled by a factor y. By appropriately selecting values for the first resistor 842 and the second resistor 844, a virtual ground for the analog baseband signal s at circuit input 810 may be presented, so that there is a weighted distortion component d*y present at the circuit output 820.

In one implementation, the circuit output 820 of the predistortion unit 800 of FIG. 8 is electrically coupled to the second input 710 of the mixer unit 700 of FIG. 7. As such the weighted distortion component d*y is present at the gate of the second transistor 740 of the mixer unit 700. The second transistor 740 then shifts the phase of the weighted distortion term as described above and also scales this term by the amplification factor of the second transistor 740, namely 1/x. As such the signal present at the drain of the second transistor 740 is −(d*y/x). This is then summed with the signal present at the drain of the first transistor 725: −s+d. In one implementation, the resultant weighted summation forms the output of the mixer unit, and as such may comprise the signal seen at output 450 in FIGS. 4 and 5 and/or output 650 in FIGS. 6A and 6B. This weighted summation may thus form the input for a later power amplification stage (not shown).

Figure 9:
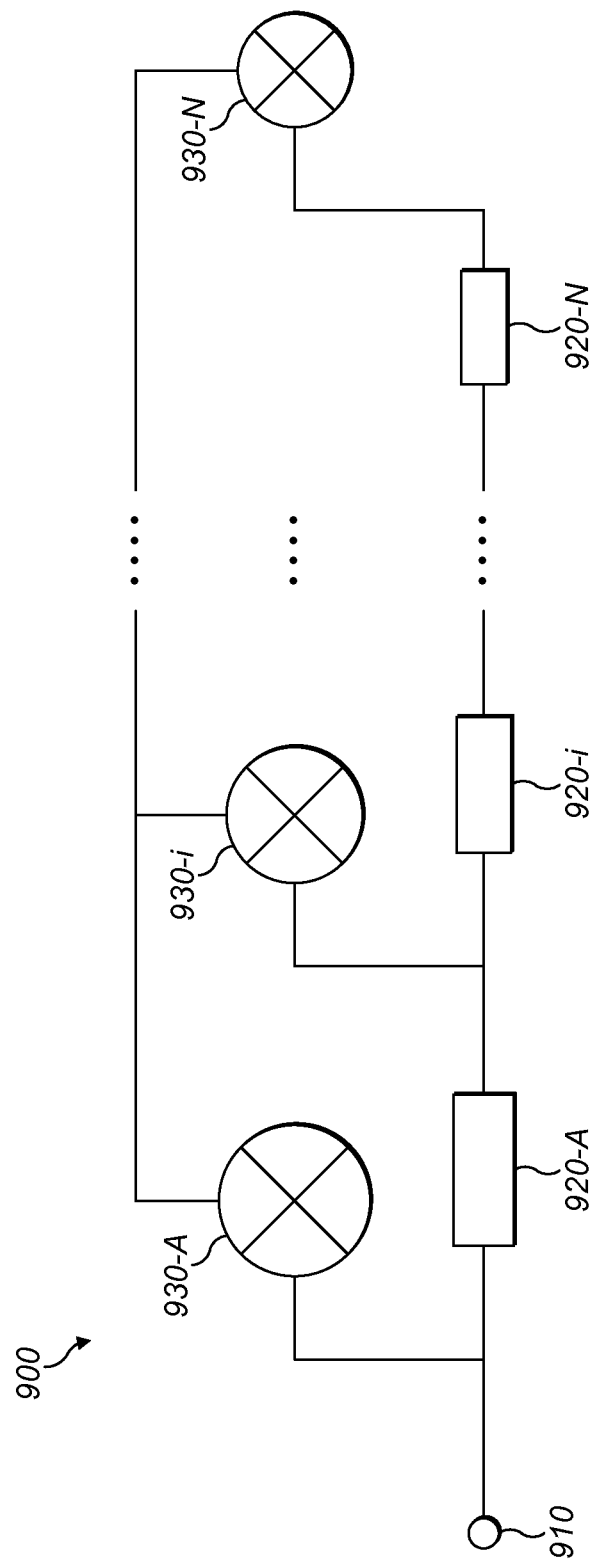
FIG. 9 is a schematic diagram showing a number of units for an apparatus for predistorting a signal arranged in series according to an example.

A variation of the above examples will now be described wherein a plurality of predistortion units are electrically coupled in series and a plurality of mixer units are electrically coupled in parallel. FIG. 9 shows such a variation. FIG. 9 shows a portion 900 of an apparatus that may be used to linearize a signal in a multi-stage process. For example it may be used to implement the second processing block 430 in FIGS. 4 and 5 and/or the signal cancellation and predistortion unit 630 in FIGS. 6A and 6B.

In FIG. 9 an analog baseband signal is received at input 910. Input 910 is electrically coupled to a first predistortion unit 920-A and a first mixer unit 930-A. The first predistortion unit 920-A and the first mixer unit 930-A may be respectively implemented by suitably adapted versions of the electrical circuits shown in FIGS. 8 and 7. For example, input 910 may be electrically coupled to a first circuit input 705 of a suitably adapted mixer unit 700 as well as a circuit input 810 of a suitably adapted predistortion unit 800. As shown in FIG. 9 the first predistortion unit 920-A is electrically coupled in series with a number of other predistortion units 920. In the Figure an output of the first predistortion unit 920-A is electrically coupled to an input of a representative ith predistortion unit 920-i. For example, this may be implemented be electrically coupling a circuit output 820 of the first predistortion unit 920-A to a circuit input 810 of the ith predistortion unit 920-i. This may be continued a number of times, chaining predistortion units in series until the sequence is terminated by a terminating predistortion unit 920-N.

Returning to the output of the first predistortion unit 920-A, this is also electrically coupled to an input of an ith mixer unit 930-i, i.e. circuit output 820 of the first predistortion unit 920-A may be electrically coupled to an input 710 of the ith mixer unit 930-i. The outputs of each mixer unit 930 in FIG. 9 are electrically coupled, forming a chain arranged in parallel. The common output of the mixer units 930 may in some cases be electrically coupled to an RLC resonator circuit forming part of transmission circuitry. The sequence of mixer units 930 is terminated by a mixer unit 930-N that receives, as an input, an output of the terminating predistortion unit 920-N. For example, a circuit output 820 of the terminating predistortion unit 920-N may be electrically coupled to an input 710 of the mixer unit 930-N.

In the variation shown in FIG. 9, each predistortion unit 920 may be arranged to perform specialized and/or differentiated signal processing. If each predistortion unit 920 is arranged to perform signal cancellation of a portion of an input signal, then spectral bands of the signal that fall outside of a spectral band cancelled by a particular predistortion unit are passed to one or more subsequent predistortion units. One or more of these subsequent predistortion units may then be arranged to cancel components representing the spectral bands. For example, a set of signal peaks that overshoot a first predistortion unit may not be cancelled, and so may be provided to second predistortion unit in the chain. Circuit output 820 from a predistortion unit may provide signal cancellation for an auxiliary processing path or distortion branch and summation node 745 in a mixer unit may provide signal cancellation for distortion products at the output of the modulator. In turn, any signal peaks overshooting the second predistortion unit that are not be cancelled may be passed to a third predistortion unit and so on. The chaining of predistortion units may be applied to meet a particular set of spectral requirements, e.g. until spectral peaks for an Nth component are below a noise floor. In this case there will be N sets of predistortion and mixer units. In one implementation N may be 2 or 3.

In this variation each individual step is fully adaptive to a signal peak-to-average value that is being transmitted. In this case the predistortion and signal cancellation are working simultaneously. The variation may be useful for higher level modulations with high peak-to-average value. For example, for a transmit signal with a high peak-to-signal ratio (PAR) it is challenging to maintain good efficiency. If a first predistortion unit filters (e.g. clips or distorts) a signal, it filters in the same manner as a first mixer unit cell. In this case signal cancellation may not be complete and the filtered signal is fed to the next predistortion/mixer combination for additional cancellation and so on.

FIGS. 7 and 8 show examples that assume a baseband signal s is driven from a low impedance source when compared to the first and second resistors 842 and 844 in the voltage divider 840 of FIG. 8. If a baseband signal is driven from a relatively high impedance source, for example when compared to the first and second resistors 842 and 844, one or more of a terminating predistortion unit and a mixer unit may be used as end units (e.g. units 920-N and 930-N in FIG. 9).

Figure 10A:
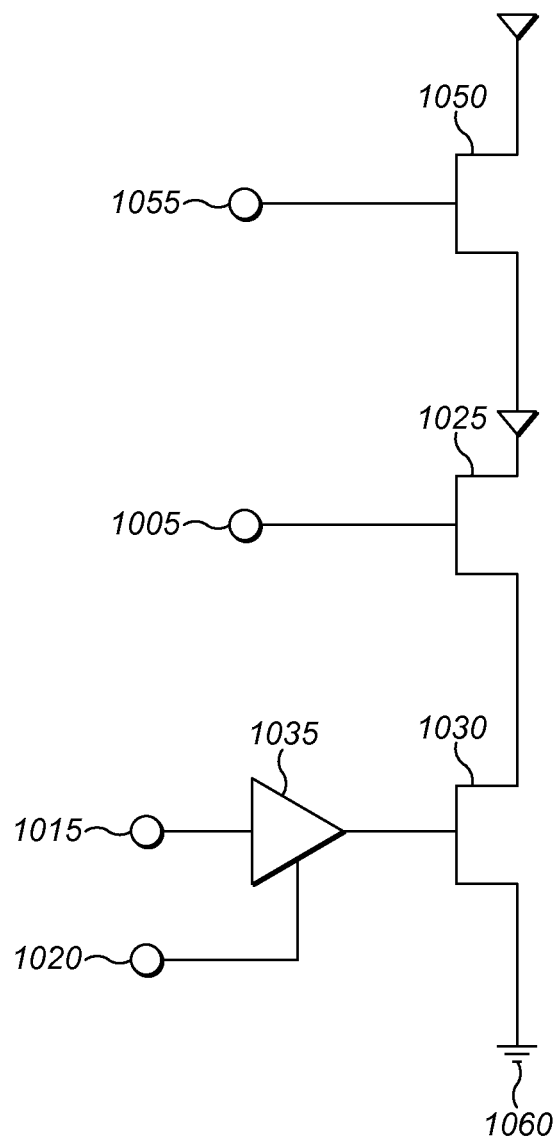
FIG. 10A is a schematic circuit diagram showing an electrical circuit for implementing a mixer unit according to an example.

FIG. 10A shows an example of a mixer unit that may be used as a mixer unit, for example as described with reference to FIG. 9 above. In this case the mixer unit has a single 'baseband signal' branch and the 'distortion' branch as shown in FIG. 7 is omitted. As such the mixer unit comprises an input 1005 that is electrically coupled to the gate of a terminating transistor 1025. The source of the terminating transistor 1025 is electrically coupled to a drain of a local oscillator transistor 1030, the source of the local oscillator transistor 1030 being electrically coupled to ground 1060. A gate of the local oscillator transistor 1030 is electrically coupled to a local oscillator amplifier 1035 that is controlled using a control input 1020. The local oscillator amplifier 1035 is in turn arranged to receive a signal from a local oscillator input 1015. Returning to the terminating transistor 1025, a drain of said transistor is electrically coupled to a source of a gain control transistor 1050, whose gate is electrically coupled to a gain control signal 1055 so as to apply automatic gain control if required in an implementation. A drain of the gain control transistor 1050 may be coupled to a common output of a plurality of mixer units, as for example demonstrated in FIG. 9. The terminating transistor 1025 and the local oscillator transistor 1035 may have the same characteristics as the previously described first transistor 725 and first local oscillator transistor 735-A.

Figure 10B:
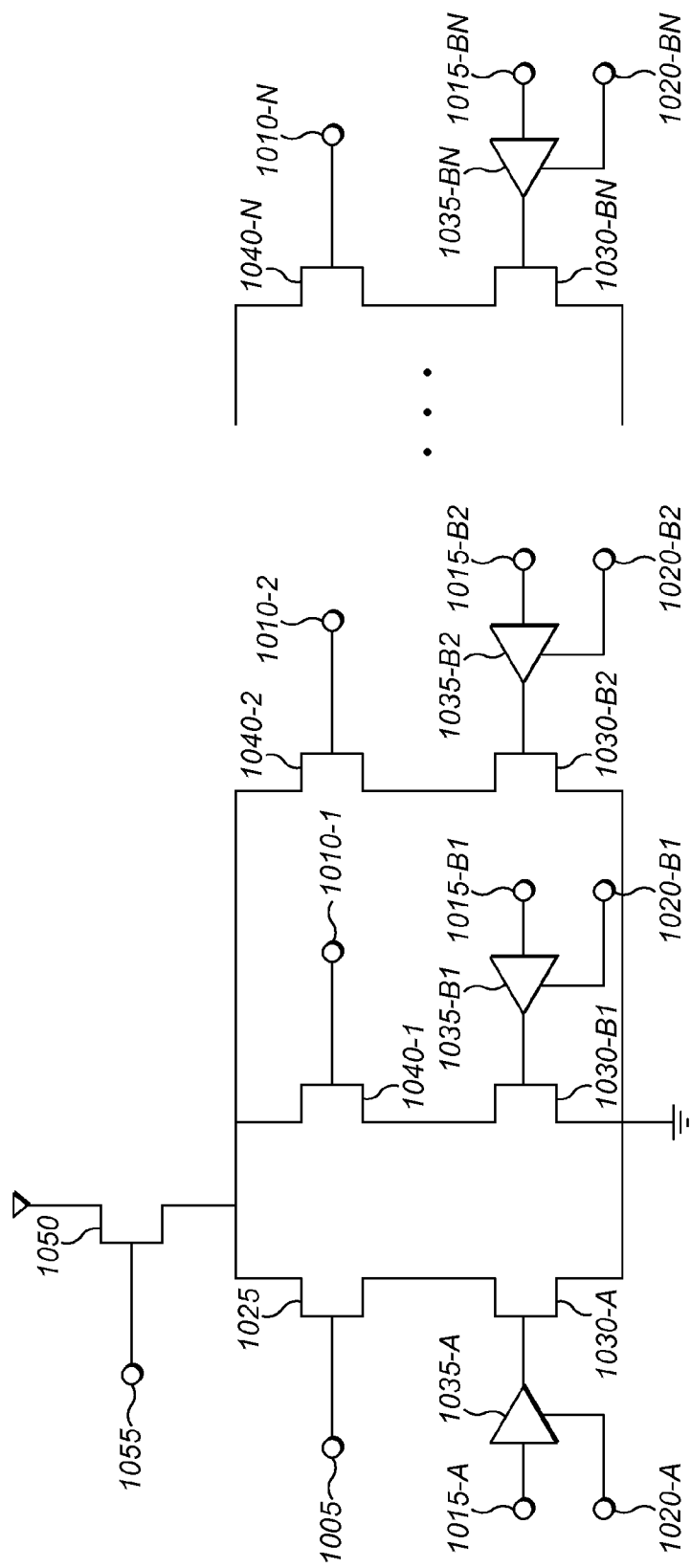
FIG. 10B is a schematic circuit diagram showing an example electrical circuit for implementing an apparatus as shown in FIG. 9.

FIG. 10B shows one implementation of the apparatus shown in FIG. 9. The circuit shown in FIG. 10B may be considered an adapted version of the circuit shown in FIG. 7 or FIG. 10A. As such the circuit of FIG. 10B comprises a first circuit input 1005 arranged to receive an analog baseband signal s and a first local oscillator circuit input 1015-A. The first circuit input 1005 is electrically coupled to the gate of a first transistor 1025. The source of the first transistor 1025 is electrically coupled to a drain of a first local oscillator transistors 1030-A. A gate of the first local oscillator transistor 1030-A is electrically coupled to a local oscillator amplifier 1035-A that is controlled using control input 1020-A. The local oscillator amplifier 1035-A is in turn arranged to receive a signal from the first local oscillator circuit input 1015-A. The drain of the first transistor 1025 is electrically coupled to the source of a gain control transistor 1050, whose gate is electrically coupled to an automatic gain control input 755. For example, these features are shown in the circuit of FIG. 10A.

The circuit of FIG. 10B also comprises a number of circuit portions (which may be referred to herein as mixer units) for mixing a respective number of predistortion signals. In FIG. 10B there are N such portions. Each portion comprises components similar to the distortion branch of the circuit of FIG. 7. For example, each portion comprises a predistortion signal input 1010 that is electrically coupled to a gate of a distortion branch transistor 1040. A drain of the distortion branch transistor 1040 is electrically coupled to the drain of the first transistor 1025 and all other distortion branch transistors in the series. A source of each distortion branch transistor 1040 is electrically coupled to a drain of a distortion branch local oscillator transistor 1030-B. A gate of the distortion branch local oscillator transistor 1030-B is electrically coupled to a local oscillator amplifier 1035-B that is controlled using control input 1020-B. The local oscillator amplifier 1035-B is in turn arranged to receive a signal from a distortion branch local oscillator circuit input 1015-B. The sources of all local oscillator transistors 1030 are electrically coupled to ground 1060.

Each predistortion signal input 1010-1, 1010-2, 1010-N receives a predistortion signal from a corresponding predistortion unit (see, for example, FIG. 11B as described below). For example, the first predistortion signal input 1010-1 in FIG. 10B may receive a first predistortion signal $sd_1$, the second predistortion signal input 1010-2 may receive a second predistortion signal $sd_2$ and the Nth predistortion signal input 1010-N may receive an Nth predistortion signal $sd_N$. In one implementation the Nth predistortion signal input 1010-N may also be electrically coupled to a terminating predistortion unit as described below; in other implementations a terminating predistortion unit may not be supplied. An out of the circuit in FIG. 10B may be taken at the drain of the gain control transistor 1050.

Figure 11A:
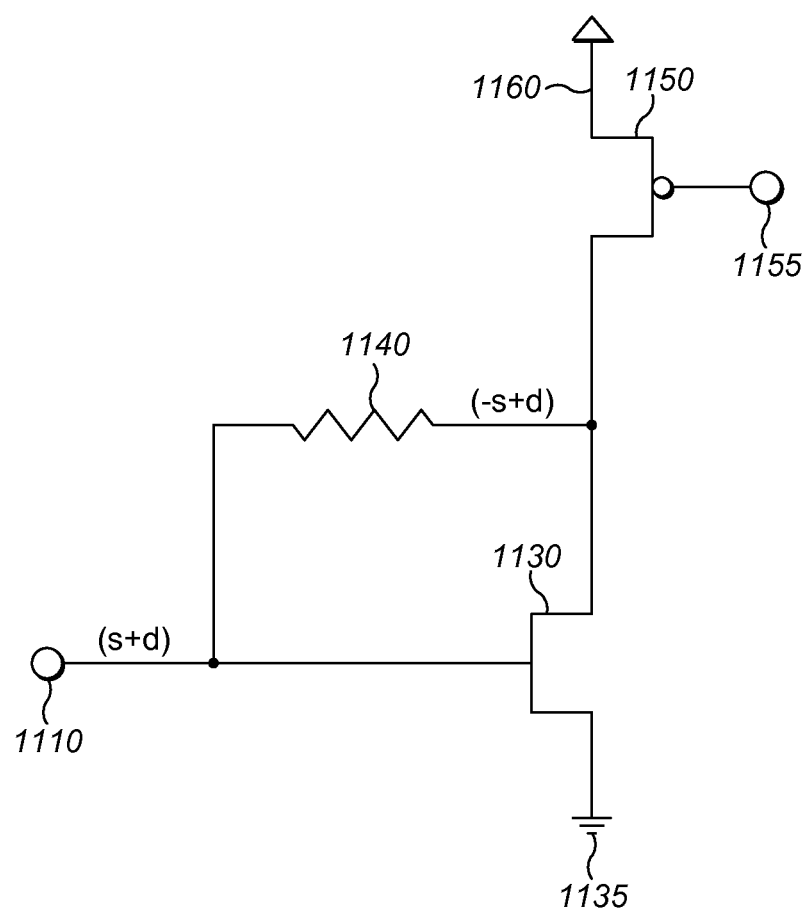
FIG. 11A is a schematic circuit diagram showing an electrical circuit for implementing a terminating predistortion unit according to an example.

FIG. 11A shows an example of a predistortion unit that may be used as a terminating predistortion unit, for example as described with reference to FIG. 9 above or on its own as a predistortion unit with the mixer unit of FIG. 10A with no additional predistortion. The circuit of FIG. 11A is similar to that of FIG. 8, but instead of voltage divider 840 a third resistor 1140 is provided that is electrically coupled at a first end to a circuit node 1110 and at a second end a drain of a predistortion transistor 1130. The circuit node 1110 acts as a terminating node, e.g. is both input and output of the circuit of FIG. 11A. As in FIG. 8, a source of a predistortion transistor 1130 is electrically coupled to ground 1135 and the drain of the predistortion transistor 1130 is also electrically coupled to a power supply section via a source of a P-channel supply transistor 1150. Again, a gate of the supply transistor 1150 is electrically coupled to a voltage bias 1155 and a drain of the same transistor is electrically coupled to a power supply 1160. Rather than being scaled by y as in the predistortion unit of FIG. 8, the predistortion transistor 1130 has an amplification factor equal to the terminating transistor 1025.

In this variation, the circuit node 1110 is electrically coupled to the input 1005 of the mixer unit. In an implementation based on, for example, FIG. 9, the circuit node 1110 of the terminating predistortion unit receives a predistortion signal from a previous predistortion unit, e.g. $sd_{(N-1)}$ from a penultimate unit in a series such as that shown in FIG. 9. At the drain of the predistortion transistor 1130 there is the same distortion component that would be seen at the drain of the terminating transistor 1025.

Figure 11B:
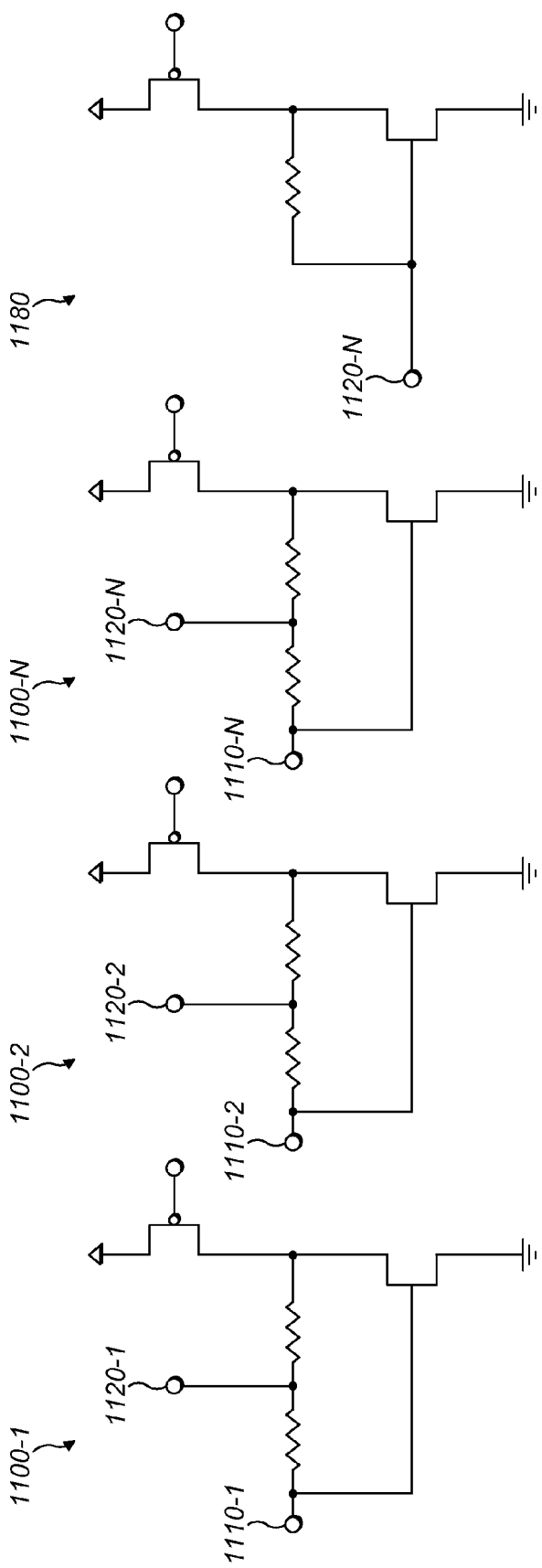
FIG. 11B shows a number of schematic circuit diagrams that demonstrate how certain predistortion cells may be coupled to implement an apparatus as shown in FIG. 9.

FIG. 11B shows how a terminating predistortion unit 1180 may be used with a number of predistortion units 1100 arranged in series. For example, the predistortion units in FIG. 11B may be used with the circuit shown in FIG. 10B. In FIG. 11B, N predistortion units similar to the unit in FIG. 8 are shown. A first predistortion unit 1100-1 receives a baseband signal s at input 1110-1 and outputs a first predistortion signal, $sd_1$, at output 1120-1. This first predistortion signal may, for example, be supplied to circuit input 1010-1 in FIG. 10B. Similarly, a second predistortion unit 1100-2 receives the first predistortion signal $sd_1$ at input 1110-2 and outputs a second predistortion signal, $sd_2$, at output 1120-2. The second predistortion signal, $sd_2$, may be passed to circuit input 1010-2 in FIG. 10B. This sequence is followed for N predistortion units, for example at an Nth predistortion unit 1100-N an (N−1)th predistortion signal $sd_{(N-1)}$ is received, processed and output as an Nth predistortion signal $sd_N$ at output 1120-N. The Nth predistortion signal $sd_N$ may be passed to circuit input 1010-N in FIG. 10B. In this example the terminating predistortion unit 1180 may also be coupled to circuit input 1010-N, i.e. terminating input 1120-N in FIG. 11B may be coupled to circuit input 1010-N. In other examples the terminating predistortion unit 1180 may be omitted.

Figure 11C:
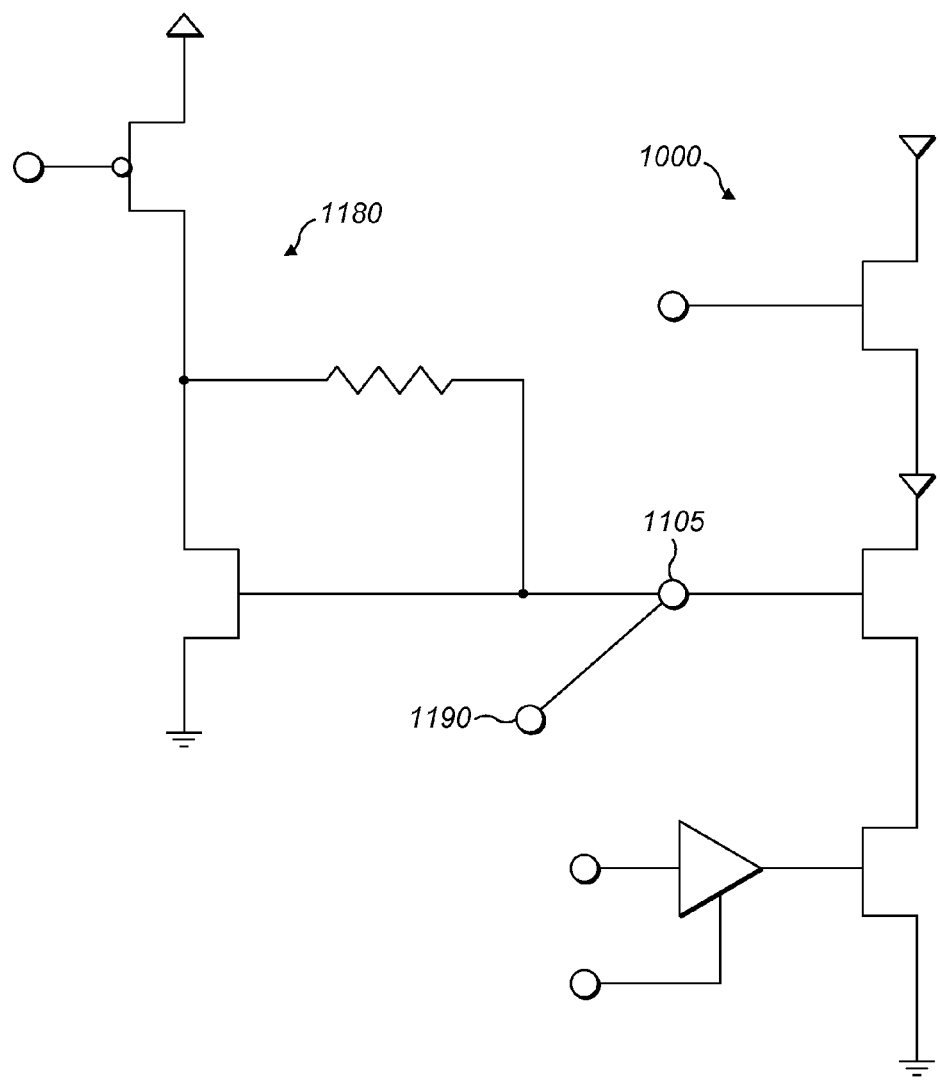
FIG. 11C is a schematic circuit diagram showing an example coupling for a terminating predistortion unit and mixer unit.

Another example is shown in FIG. 11C. This example shows the stand-alone use of a terminating predistortion unit 1180, such as that shown in FIG. 11A, and a mixer unit 1000 such as that shown in FIG. 10A. In this case, circuit node 1110 of the terminating predistortion unit in FIG. 11A is electrically coupled to a circuit input 1005 of a mixer unit. The same circuit input 1005 is further electrically coupled to a baseband input signal s. In this case the same distortion component d is available at the gate of the terminating transistor 1025, e.g. at the gate of terminating transistor 1025 there is the signal s+d, i.e. the signal and distortion components are present at the same time at the input of the mixer unit 1000. The input of signal s+d to the gate of terminating transistor 1025 results in signal term −s available at the drain of the terminating transistor 1025. This is because the distortion term d in the input signal and the phase shifted distortion term −d at the drain of the terminating transistor 1025 cancel each other and therefore only the signal term −s is present at the drain of terminating transistor 1025. In other words, due to the action of terminating transistor 1025 voltage signals are transformed to current signals by the transconductance of said transistor, resulting in there being only the signal component −s present at the drain of the transistor. Variations of this same process also apply when the termination predistortion unit is used in a series arrangement. In cases such as those, the signal s above may be a predistortion signal $sd_N$ as described with reference to FIG. 11B.

In certain cases the noise energy of the third resistor may be fed into the signal path in these examples; however this can be remedied by using a weighting factor to attenuate the noise. In certain variations that are not shown, a signal from a main analog processing pathway or branch may be supplied, in whole or part, to an auxiliary processing pathway or branch, for example for mixing, in whole or part, with one or more signals that result from the individual predistortion units.

A number of further variations for an electrical circuit to implement the predistortion unit of FIG. 8 will now be described with reference to FIGS. 12 to 14. These variations may be used individually, or in series as described with reference to FIG. 9. They may also be used with, or without, the terminating predistortion unit shown in FIG. 11A.

Figure 12:
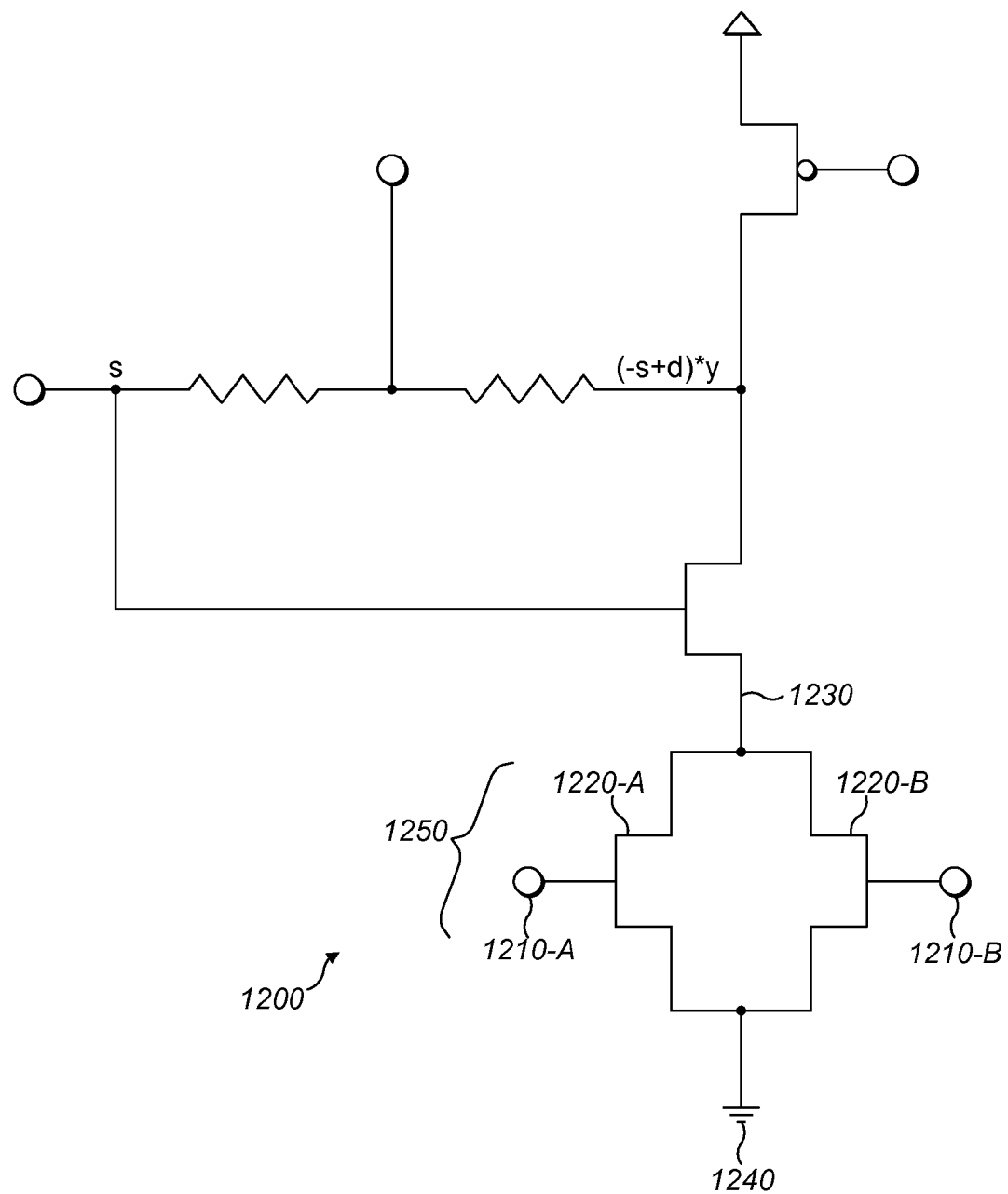
FIG. 12 is a schematic circuit diagram showing an electrical circuit for implementing a predistortion unit according to a first variation.

FIG. 12 shows a variation wherein a common-mode matching section 1200 is added between the source of the predistortion transistor 830 of FIG. 8 and ground. In particular, a pair 1250 of local oscillator transistors are supplied that mimic the common-mode conditions seen by the second transistor 740 of FIG. 7.

In more detail, FIG. 12 has a pair of local oscillator inputs 1210. A first local oscillator input 1210-A receives a local oscillator signal (LO) as per the local oscillator circuit inputs 715 of FIG. 7. A second local oscillator input 1210-B receives a local oscillator signal corresponding to the signal supplied to local oscillator circuit inputs 715 of FIG. 7 but in this case scaled by y, i.e. y*LO, wherein y is the ratio factor of the transistors in FIG. 7. The first local oscillator input 1210-A is electrically coupled to a first local oscillator transistor 1220-A, whose drain is then electrically coupled to a circuit node 1230 that is also electrically coupled to the source of the predistortion transistor 830 of FIG. 8. Similarly, the second local oscillator input 1210-B is electrically coupled to a second local oscillator transistor 1220-B, whose drain is then electrically coupled to the circuit node 1230. The sources of both local oscillator transistors 1220 are electrically coupled to ground 1240. To match the predistortion transistor 830 of FIG. 8, both local oscillator transistors 1220 also have an amplification factor of y in relation to an amplification factor of a first transistor 725 in FIG. 7. This variation may be, amongst others, applied to the predistortion units shown in FIG. 11B, including the terminating predistortion unit 1180.

Figure 13:
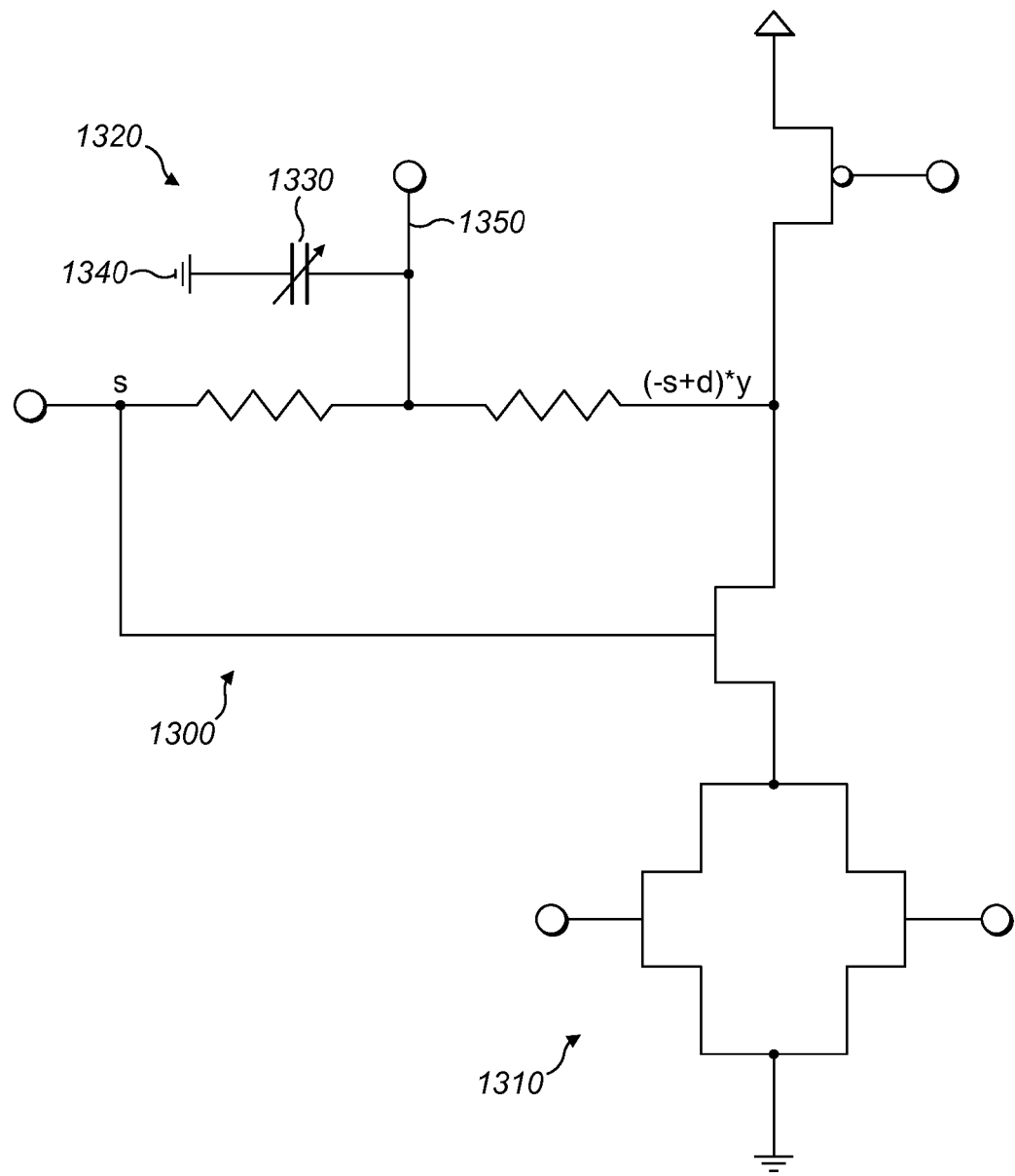
FIG. 13 is a schematic circuit diagram showing an electrical circuit for implementing a predistortion unit according to a second variation.

FIG. 13 shows a variation wherein a tunable component is provided so as to control a phase of a weighted distortion component produced by a distortion unit. In the example of FIG. 13 circuit portion 1300 is similar to the circuit of the predistortion unit 800 shown in FIG. 8. A circuit portion 1310 for mimicking common-mode conditions seen by the second transistor 740 of FIG. 7 is also provided, for as example as described with reference to FIG. 12; however this may be omitted in other examples. In FIG. 13 a tuning section 1320 is added that comprises a tunable component, which in this case is a tuning capacitor 1330. The tuning capacitor 1330 is electrically coupled between ground 1340 and a circuit output 1350. In this variation, the tuning capacitor 1330 may be used to control the phase of the weighted distortion term d*y. This has an effect of improving harmonic rejection because a phase of a distortion component seen at the drain of the predistortion transistor 830 of FIG. 8 can be chosen to inversely match, i.e. be 180 degrees out-of-phase with, a phase of a distortion component seen at the drain of the first transistor 725 of FIG. 7. Additionally, by using this effect together with a number of predistortion units arranged in series, a tuning component of a particular predistortion unit in the series may be configured to accurately apply predistortion for one particular harmonic order (e.g. 3rd-order or 5th-order distortion components).

Figure 14:
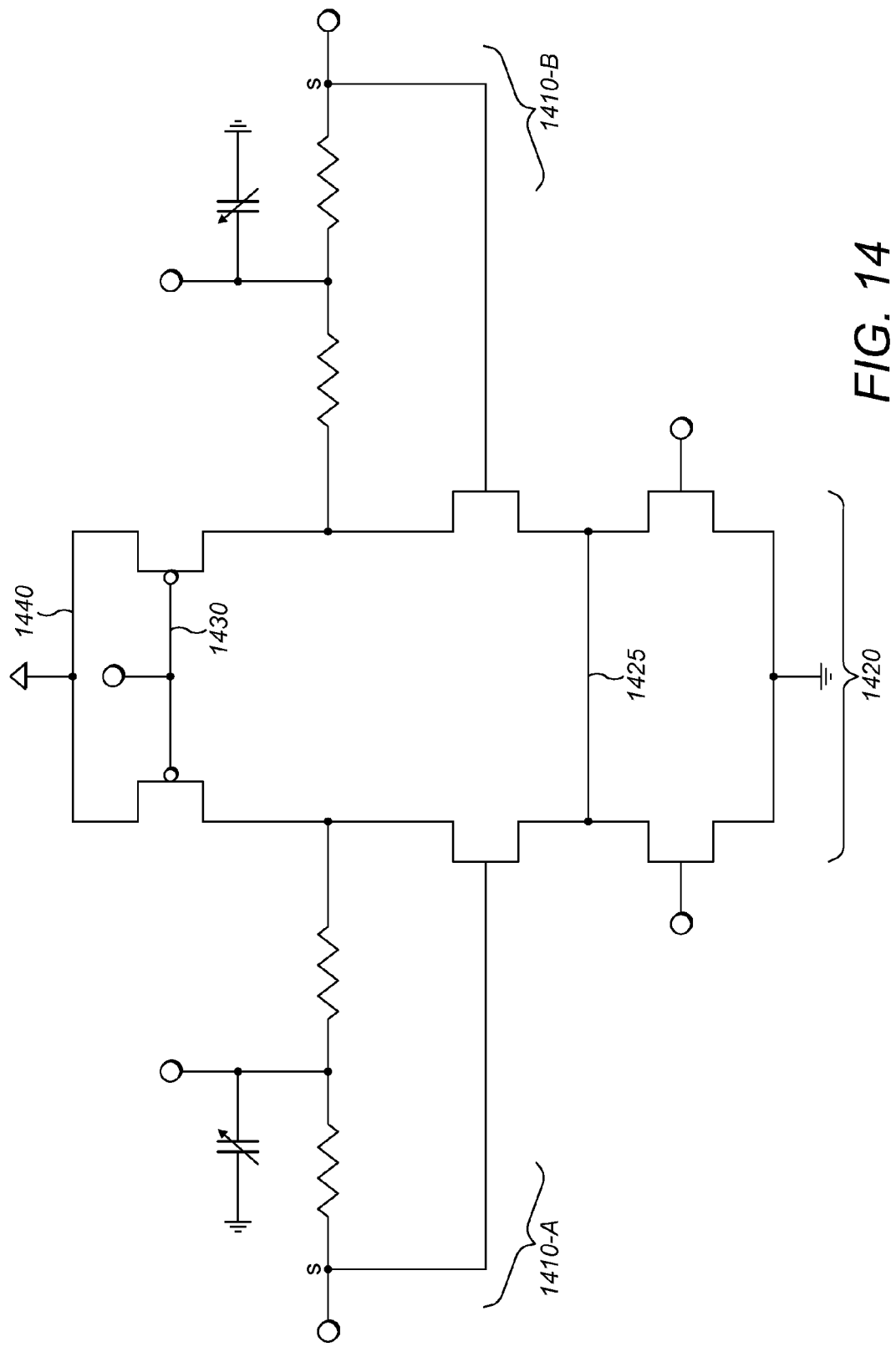
FIG. 14 is a schematic circuit diagram showing an electrical circuit for implementing a predistortion unit according to a third variation.

FIG. 14 shows a variation wherein the predistortion unit is configured for a differential implementation, as opposed to the single-ended implementations previously described. In FIG. 14 there are two predistortion unit branches 1410. These branches are shown based on the variation of FIG. 13 but they may equally be configured according to any one of the previously described examples and variations. In the example a first branch 1410-A processes a first differential signal in a differential signal pair and a second branch 1410-B processes a second differential signal in a differential signal pair. As such each branch has a corresponding circuit input and a corresponding circuit output. In the example both branches 1410 are electrically coupled to a shared common-mode matching section 1420. The drains of respective predistortion transistors (e.g. 830 as shown in FIG. 8) are also electrically coupled at node 1425, i.e. arranged in a so-called "back-to-back" configuration. As there is a shared common-mode matching section 1420 there is only pair of local oscillator transistors (e.g. 1220 in FIG. 12). This improves performance of the circuit. Even though the predistortion unit of FIG. 14 comprises a differential arrangement, the single-ended mixer unit of FIG. 7 may still be utilized separately for each differential signal.

A number of methods of predistorting a signal will now be described. These methods may be implemented using one or more of the examples and/or variations described above, or alternatively may be implemented using other apparatus.

Figure 15A:
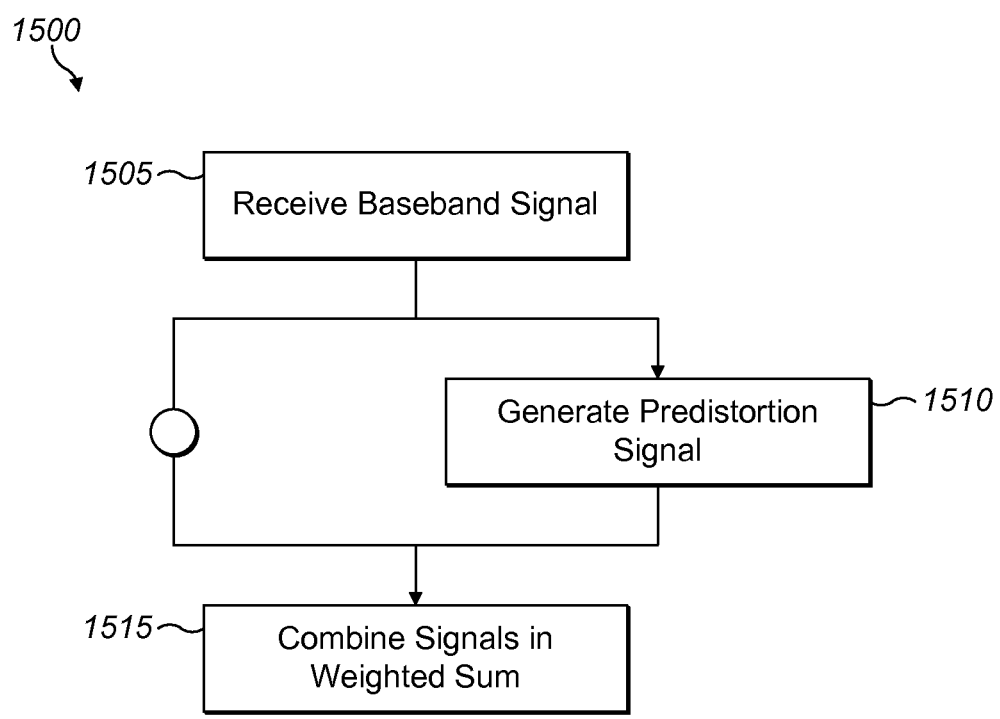
FIG. 15A is a simplified flow chart showing a method of predistorting a signal according to an example.

FIG. 15A is a flow chart showing a method 1500 of predistorting a signal. At block 1505 a baseband signal is received. At block 1510 this baseband signal is processed, in whole or in part, to generate a predistortion signal. A part of a baseband signal may be obtained using signal cancellation. At block 1515 the predistortion signal is combined in a weighted sum with the baseband signal received at block 1505, or at least a processed variation of it. This is shown by the parallel path in FIG. 15A from block 1505 to block 1515.

In the example of FIG. 15A the baseband signal may be an analog signal. Specific channel filtering may be applied to each of the summed signals. The weighted sum may be achieved by weighting or scaling each of the signals according to a particular scaling ratio.

Figure 15B:
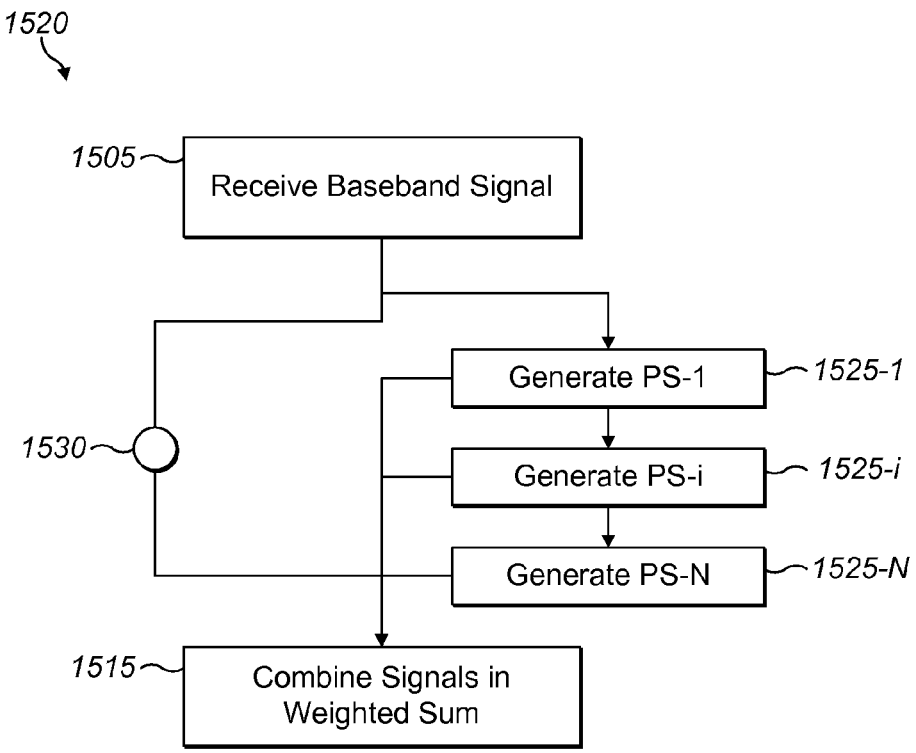
FIG. 15B is a simplified flow chart showing a method of predistorting a signal according to a first variation.

FIG. 15B shows a variation 1520 of the method 1500 of FIG. 15A. In this variation, block 1510 of FIG. 15A is split into a number of blocks 1525 that are performed in series. At block 1525-1 a first set of predistortion processing is applied to the received baseband signal. The output of the first set of predistortion processing is then supplied for summation and also supplied as an input for a subsequent block of predistortion processing 1525-i. In parallel with blocks 1525 the baseband signal is passed along a main circuit path as shown by node 1530. Node 1530 may represent processing that is applied to the baseband signal or alternatively the baseband signal may be supplied for summation without processing (e.g. "passed-through"). The sequence of predistortion blocks 1525 is continued N times with the result of each block 1525-1 to 1525-N being summed together with an output of node 1530 at block 1515.

Figure 15C:
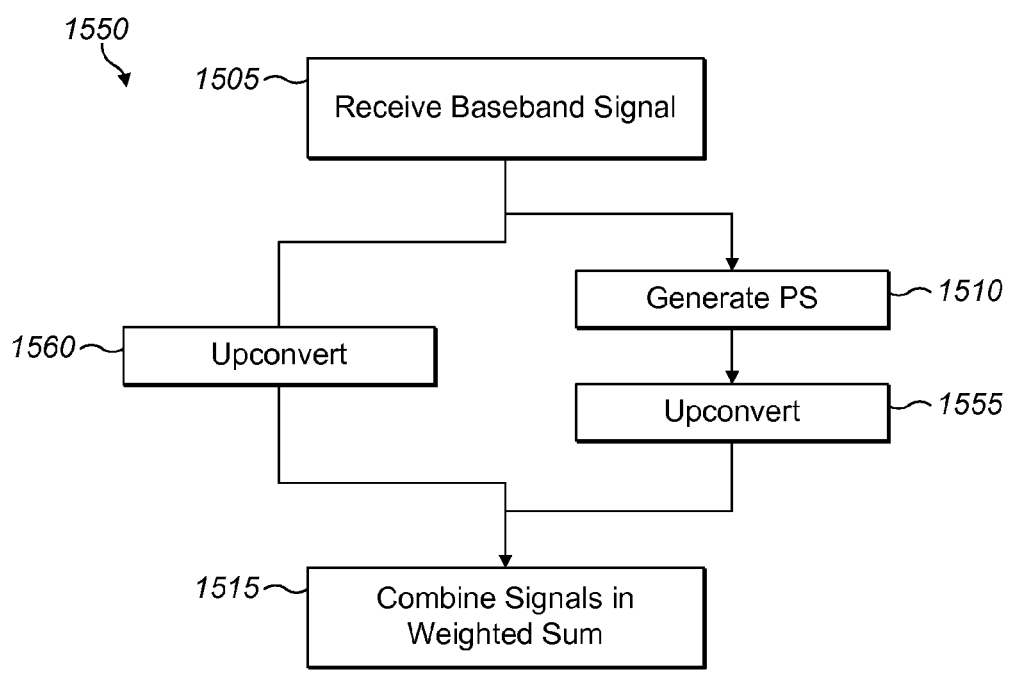
FIG. 15C is a simplified flow chart showing a method of predistorting a signal according to a second variation.

FIG. 15C shows a further variation 1550 of the method 1500 of FIG. 15A. Even though not shown for clarity, this variation may also use the multi-step process of FIG. 15B in certain circumstances. In this variation, any predistortion signals are upconverted at block 1555 before summation at block 1515. Likewise received baseband signal is also upconverted at block 1560. This results in at least two upconverted signals being combined in a weighted sum. In this case the weighting may be applied as part of the upconversion process.

Figure 16:
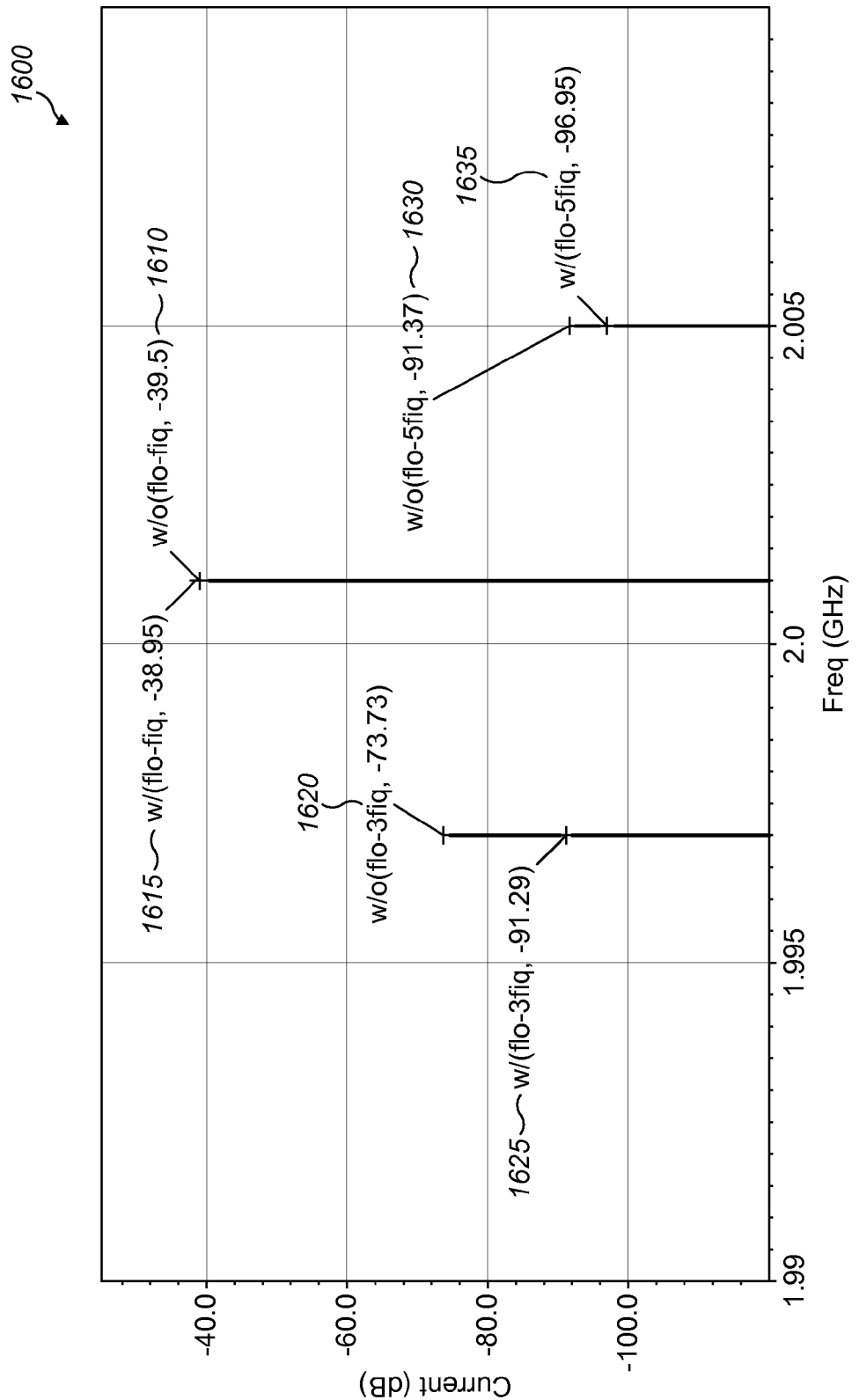
FIG. 16 is a spectrum showing simulated results with and without predistortion.

FIG. 16 shows a set of simulated results using certain examples and/or variations described herein. The simulated results show an example modulator output spectrum 1600 that has been generated based on a two-tone test. Results without predistortion as applied according to certain examples herein are shown at points 1610, 1620 and 1630 (labelled w/o). Results with such predistortion are shown at points 1615, 1625 and 1635 (labelled w). As can be seen from these results, using predistortion reduces the level of a lower $3^{rd}$ order local oscillator intermodulation product by 20 dB (e.g. comparing 1625 with 1620) and reduces the level of an upper $5^{th}$ order local oscillator intermodulation product by 5 dB (e.g. comparing 1635 with 1630) when compared to a case without such predistortion. The level of a local oscillator component is not substantially affected (e.g. comparing 1615 with 1610).

Certain examples and/or variations described herein may be easily accommodated in an integrated multi-band transmitter or transceiver circuit. The matching of circuits produced according to certain methods set out herein is good. For example, when using an integrated circuit process, transistor matching may be easily performed to a good level and resistor matching may be performed to at least a moderate-to-good level. If in certain production situations resistor matching is below a set level, the circuits described herein can be easily calibrated to accommodate variations in resistor values. As certain examples and/or variations do not make use of operational amplifiers they have a comparatively low current consumption. This makes them particularly suited to mobile communications devices where power is at a premium In addition, by avoiding the use of operational amplifiers, certain examples and/or variations can make use of adaptive currents used in high efficiency transmission cases. The example of FIG. 7 and its variants is particularly suited to transmitting signals in systems that require a high crest factor, such as LTE. Certain examples and/or variations described herein have advantages when compared to methods of linearization that increase a current consumption to provide a required back-off in power domain. By avoiding higher current consumption these examples and/or variations are again suited for use in a mobile terminal with high efficiency requirements. Additionally, certain examples and/or variations described herein split a baseband signal which avoids feeding the entire baseband signal through a predistortion process, e.g. an original baseband signal can be processed on a separate path that does not apply predistortion processing. This leads to more accurate baseband filtering.

Certain examples and/or variations described herein provide one or more of a mixer unit and a predistortion unit that may be implemented separately or together. For example, there is described a circuit for a predistortion unit that has certain advantages.

Certain examples and/or variations described herein provide a beneficial combination of reception band noise filtering and attenuation of intermodulation products. It avoids and/or reduces a trade-off between noise contribution and linearity. A separate path for predistortion means that a baseband-channel-filter corner-frequency can be comparatively lower, as higher-order non-linearity components can be dealt with on a parallel processing branch. Channel filtering for a baseband signal path may thus be more aggressive to lower reception band noise.

Certain examples and/or variations described herein may form part of radio transceiver implementations. In particular, they may be suitable for transmitter systems with stringent linearity specifications and high signal-to-noise ratio requirements. For example, they may allow the requirements set out in FIG. 3 to be met with good efficiency.

In one described example, there is provided apparatus for predistortion of a radio-frequency signal comprising at least one predistortion unit arranged to receive an analog baseband signal before amplification and to generate an analog predistortion signal based on said analog baseband signal and at least one mixer unit electrically coupled to the at least one predistortion unit, wherein the at least one mixer unit is arranged to receive the analog baseband signal before amplification and the analog predistortion signal and to generate a weighted combination of said signals.

In this case, the at least one predistortion unit may be arranged to output a weighted distortion component that is isolated from the analog baseband signal as the analog predistortion signal and in certain cases comprise a tunable component arranged to control a phase of the weighted distortion component. A plurality of predistortion units may be arranged in series with a further predistortion unit arranged to terminate the plurality of predistortion units arranged in series. The at least one predistortion unit may be arranged to apply predistortion and signal cancellation to the analog baseband signal to generate the analog predistortion signal.

In certain examples, the at least one mixer unit is arranged to apply a local oscillator radio-frequency signal to the analog baseband signal and the analog predistortion signal before generating a weighted combination of said signals. The apparatus may be arranged to process differential signals and each of the at least one predistortion unit and the at least one mixer unit comprises a circuit portion may be arranged to process a respective one of said differential signals. A plurality of mixer units may be arranged in parallel e.g. be coupled to a common output. The plurality of mixer units may comprise a mixer unit arranged to receive the analog baseband signal and a plurality of mixer units arranged to receive respective analog predistortion signals. A particular mixer unit may be arranged to terminate the plurality of mixer units if required. In this case "mixer unit"

may correspond to the whole or a part of the circuits shown for example in FIGS. 7, 10B and 11C.

In certain variations a predistortion unit is electrically coupled to ground via one or more local oscillator transistor switches. Similarly, for a given predistortion unit and corresponding mixer unit, both of said circuit portions are arranged to share one or more of a common bias voltage and a common predistortion transistor source coupling.

In certain examples, a predistortion unit comprises a predistortion transistor having a gate electrically coupled to an input of the predistortion unit; and a voltage divider electrically coupled between the input of the predistortion unit and a source of the predistortion transistor, wherein an output of the predistortion unit is provided by the voltage divider. In this case the voltage divider may comprise a first resistor and a second resistor electrically coupled in series, wherein a resistance of the first resistor and a resistance of the second resistor is selected to generate a virtual ground coupling for the input of the predistortion unit. The predistortion transistor may comprise an N-channel transistor and the predistortion unit may comprise a P-channel transistor electrically coupled in series with the predistortion transistor, the P-channel transistor having a gate electrically coupled to a bias voltage.

In certain cases predistortion unit for processing an analog signal prior to amplification by a power amplifier comprises a first input arranged to receive an analog signal derived from an analog baseband signal; a predistortion transistor electrically coupled to the first input, the predistortion transistor having a predistortion amplification factor; and a signal extraction portion electrically coupled between the first input and an output of the predistortion transistor, wherein the signal extraction portion is arranged to present a virtual ground to the analog signal received at the first input so as to extract a distortion component derived from the output of the predistortion transistor, the distortion component being weighted by the predistortion amplification factor of the predistortion transistor.

In certain examples a mixer unit comprises an input signal transistor having a gate electrically coupled to an input of the mixer unit; a predistortion transistor having a gate electrically coupled to an output of a corresponding predistortion unit, wherein a drain of the predistortion transistor is electrically coupled to a drain of the input signal transistor, and wherein the predistortion transistor has an amplification factor that is a proportion of the amplification factor of the input signal transistor.

These predistortion and mixer units may be implemented separately, i.e. a predistortion unit may be provided without the described mixer unit, e.g. with another mixing or upconversion device. Likewise, the mixer unit may be provided without the described predistortion unit. Modifications and variations described herein with reference to an example apparatus or method may also be adapted and suitably applied to one or more of a mixer unit and predistortion unit.

In certain cases, the mixer unit comprises first and second local oscillator transistors having respective gates electrically coupled to an output of a local oscillator, wherein the second local oscillator transistor has an amplification factor that is a proportion of the amplification factor of the first second local oscillator, and wherein said proportion corresponds to the proportion for the predistortion and input signal transistors. Automatic gain control may be applied to the weighted combination of said signals.

In certain case a mixer unit may comprise a modulator for processing an analog signal prior to amplification by a power amplifier comprising a first input arranged to receive an analog signal derived from an analog baseband signal; a second input arranged to receive a distortion component derived from the analog baseband signal; a local oscillator portion arranged to receive one or more local oscillator signals a first transistor electrically coupled to the first input and the local oscillator portion, wherein the first transistor is arranged to combine one of said one or more local oscillator signals with the analog signal from the first input, the first transistor having a first amplification factor; and a second transistor electrically coupled to the second input and the local oscillator portion, wherein the second transistor is arranged to combine one of said one or more local oscillator signals with the distortion component from the second input, the second transistor having a second amplification factor, wherein the first and second amplification factors are configured to weight an output of the second transistor in relation to an output of the first transistor, and wherein the output of the first transistor and the output of the second transistor are electrically coupled so as to output a modulated and predistorted analog signal for amplification by a power amplifier.

An apparatus as described in certain examples herein may comprise an input arranged to receive the analog baseband signal; a first path electrically coupled to the input and at least one mixer unit; and a second path electrically coupled to the input and at least one predistortion unit, an output of the second path also being electrically coupled to said at least one mixer unit. A first channel filter may be applied on the first path and a second channel filter is applied on the second path, the first and second channel filters having different filter characteristics.

An apparatus as described in certain examples herein may form part of a transmitter or transceiver comprising at least one antenna and at least one power amplifier, wherein an output of the apparatus is electrically coupled to an input of the at least one power amplifier and an output of the at least one power amplifier is electrically coupled to the at least one antenna. The transmitter or transceiver may be used in user or other network equipment.

According to certain described examples, there is provided a method of predistorting of a radio-frequency signal comprising receiving an analog baseband signal before amplification; passing said received analog baseband signal to a first path and a second path; generating, via the second path, an analog predistortion signal based on said analog baseband signal; and combining, in a weighted summation, respective outputs of the first and second paths. The first path may be a main signal path and the second path may be a compensation signal path.

In general methods may be adapted in a similar way to the described apparatus. For example, generating an analog predistortion signal may comprise generating a weighted distortion component that is isolated from the analog baseband signal and a first weight may be applied to generate the weighted distortion component and a second weight may be applied to generate said weighted summation.

In this case, the first and second weights may be selected to cancel one or more distortion components in the received analog baseband signal.

In certain examples, generating a weighted distortion component comprises at least one of controlling a phase of the weighted distortion component, scaling an input signal on the second path and using a voltage divider electrically coupled to an input signal on the second path, wherein resistance values of the voltage divider are selected to isolate said distortion component.

A local oscillator radio-frequency signal may be applied to outputs of the first and second paths. Such a local oscillator radio-frequency signal may be scaled by a factor during application to an output of the second path, said factor corresponding to the proportion of the output of the second path in said weighted summation.

The method may be followed by a process of amplifying, using a power amplifier, a radio-frequency signal derived from said weighted summation.

In a particular variation, the second path comprises a plurality of predistortion units arranged in series and a plurality of corresponding mixer units arranged in parallel, and generating an analog predistortion signal comprises passing an output of at least one predistortion unit in said series to an input of a subsequent predistortion unit in said series and a subsequent mixer unit. Specific channel filtering may be applied to any of the signals.

The above embodiments are to be understood as illustrative examples of the invention. Further embodiments of the invention are envisaged. For example, even though specific circuit arrangements have been shown, it is to be understood that these are supplied for example only and that other functionally equivalent circuit implementations may be provided if desired. Transistors as described herein may be implemented by a suitable type, such as MOSFETs or any other suitable amplifier. Signals referred to in italics may refer to alternating current signals, which in certain cases may be radio-frequency signals, e.g. signals that have a frequency or frequency range at a set point above 0 Hz such as cellular or mobile radio. Certain methods and examples as described herein may be used to design analog circuits and/or construct integrated circuits; in particular modulators such as those for a current-mode, and these may be single-ended or differential. Mobile devices as referred to herein may include mobile or cell phones (including so-called "smart phones"), personal digital assistants, pagers, tablet and laptop computers, content-consumption or generation devices (for music and/or video for example), data cards, USB dongles, etc. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

We claim:

1. An apparatus for predistortion of a radio-frequency signal comprising:
   at least one predistortion circuit electrically coupled to ground and configured to receive an analog baseband signal before amplification and to generate an analog predistortion signal based on said analog baseband signal; and
   at least one mixer circuit electrically coupled to the at least one predistortion circuit,
   wherein the at least one mixer circuit is configured to receive the analog baseband signal before amplification and the analog predistortion signal and to generate a weighted combination thereof,
   wherein the said at least one predistortion circuit is electrically coupled to ground via one or more local oscillator transistor switches.

2. The apparatus according to claim 1, wherein the at least one predistortion circuit is configured to output a weighted distortion component that is isolated from the analog baseband signal as the analog predistortion signal.

3. The apparatus according to claim 1, comprising a plurality of said predistortion circuits arranged in series.

4. The apparatus according to claim 1, wherein the at least one predistortion circuit is configured to apply predistortion and signal cancellation to the analog baseband signal to generate the analog predistortion signal.

5. The apparatus according to claim 1, comprising:
   an input configured to receive the analog baseband signal;
   a first path electrically coupled to the input and at least one mixer circuit; and
   a second path electrically coupled to the input and at least one predistortion circuit, an output of the second path also being electrically coupled to said at least one mixer circuit.

6. The apparatus according to claim 5, wherein a first channel, filter is applied on the first path and a second channel filter is applied on the second path, the first and second channel filters having different filter characteristics.

7. An apparatus for predistortion of a radio-frequency signal comprising:
   at least one predistortion circuit electrically coupled to ground and configured to receive an analog baseband signal before amplification and to generate an analog predistortion signal based on said analog baseband signal; and
   at least one mixer circuit electrically coupled to the at least one predistortion circuit,
   wherein the at least one mixer circuit is configured to receive the analog baseband signal before amplification and the analog predistortion signal and to generate a weighted combination thereof,
   wherein the apparatus is configured to process differential signals and each of the at least one predistortion circuit and the at least one mixer circuit comprises a circuit portion configured to process a respective one of said differential signals, and
   wherein, for a given predistortion circuit and corresponding mixer circuit, both of said circuit portions are configured to share one or more of a common bias voltage and a common predistortion transistor source coupling.

8. An apparatus for predistortion of a radio-frequency signal comprising:
   at least one predistortion circuit electrically coupled to ground and configured to receive an analog baseband signal before amplification and to generate an analog predistortion signal based on said analog baseband signal; and
   at least one mixer circuit electrically coupled to the at least one predistortion circuit,
   wherein the at least one mixer circuit is configured to receive the analog baseband signal before amplification and the analog predistortion signal and to generate a weighted combination thereof,
   wherein the apparatus further comprises a mixer circuit configured to receive the analog baseband signal and a plurality of mixer circuits to receive respective analog predistortion signals.

9. An apparatus for predistortion of a radio-frequency signal comprising:
   at least one predistortion circuit electrically coupled to around and configured to receive an analog baseband signal before amplification and to generate an analog predistortion signal based on said analog baseband signal; and at least one mixer circuit electrically coupled to the at least one predistortion circuit, wherein the at least one mixer circuit is configured to receive the analog baseband signal before amplification and the analog predistortion signal and to generate a weighted combination thereof, wherein a said predistortion circuit comprises:

a predistortion transistor having a gate electrically coupled to an input of the predistortion circuit; and a voltage divider electrically coupled between the input of the predistortion circuit and a source of the predistortion transistor, wherein an output of the predistortion circuit is provided by the voltage divider.

10. The apparatus according to claim 9, wherein the voltage divider comprises a first resistor and a second resistor electrically coupled in series, wherein a resistance of the first resistor and a resistance of the second resistor is selected to generate a virtual ground coupling for the input of the predistortion circuit.

11. The apparatus according to claim 9, wherein the predistortion transistor comprises an N-channel transistor and the predistortion circuit comprises:

a P-channel transistor electrically coupled in series with the predistortion transistor, the P-channel transistor having a gate electrically coupled to a bias voltage.

12. An apparatus for predistortion of a radio-frequency signal comprising:

at least one predistortion circuit electrically coupled to ground and configured to receive an analog baseband signal before amplification and to generate an analog predistortion signal based on said analog baseband signal; and at least one mixer circuit electrically coupled to the at least one predistortion circuit, wherein the at least one mixer circuit is configured to receive the analog baseband signal before amplification and the analog predistortion signal and to generate a weighted combination thereof, wherein said at least one mixer circuit comprises:

an input signal transistor having a gate electrically coupled to an input of the mixer circuit;

a predistortion transistor having a gate electrically coupled to an output of a corresponding predistortion circuit, wherein a drain of the predistortion transistor is electrically coupled to a drain of the input signal transistor, and wherein the predistortion transistor has an amplification factor that is a proportion of the amplification factor of the input signal transistor.

13. The apparatus according to claim 12, wherein the mixer circuit comprises:

first and second local oscillator transistors having respective gates electrically coupled to an output of a local oscillator, wherein the second local oscillator transistor has an amplification factor that is a proportion of the amplification factor of the first second local oscillator, and wherein said proportion corresponds to the proportion far the predistortion and input signal transistors.

14. A modulator for processing an analog signal prior to amplification by a power amplifier comprising:

a first input configured to receive an analog signal derived from an analog baseband signal;

a second input configured to receive a distortion component derived from the analog baseband signal;

a local oscillator portion configured to receive one or more local oscillator signals;

a first transistor electrically coupled to the first input and the local oscillator portion, wherein the first transistor is configured to combine one of said one or more local oscillator signals with the analog signal from the first input, the first transistor having a first amplification factor; and a second transistor electrically coupled to the second input and the local oscillator portion, wherein the second transistor is configured to combine one of said one or more local oscillator signals with the distortion component from the second input, the second transistor having a second amplification factor, wherein the first and second amplification factors are configured to weight an output of the second transistor in relation to an output of the first transistor, and wherein the output of the first transistor and the output of the second transistor are electrically coupled so as to output a modulated and predistorted analog signal for amplification by a power amplifier.

* * * * *

UNITED STATES PATENT AND TRADEMARK OFFICE
CERTIFICATE OF CORRECTION

PATENT NO. : 9,515,685 B2  
APPLICATION NO. : 14/249796  
DATED : December 6, 2016  
INVENTOR(S) : Juhani Kalervo Aalto et al.

Page 1 of 1

It is certified that error appears in the above-identified patent and that said Letters Patent is hereby corrected as shown below:

In the Claims

Column 20, Line 64, Claim 9, change "around" to --ground--.

Signed and Sealed this  
Thirteenth Day of February, 2018

Andrei Iancu  
*Director of the United States Patent and Trademark Office*